United States Patent
Hamouda

(10) Patent No.: US 12,411,422 B2
(45) Date of Patent: Sep. 9, 2025

(54) METHOD FOR RULE-BASED RETARGETING OF TARGET PATTERN

(71) Applicant: ASML NETHERLANDS B.V., Veldhoven (NL)

(72) Inventor: Ayman Hamouda, Milpitas, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 131 days.

(21) Appl. No.: 17/769,107

(22) PCT Filed: Sep. 24, 2020

(86) PCT No.: PCT/EP2020/076639
§ 371 (c)(1),
(2) Date: Apr. 14, 2022

(87) PCT Pub. No.: WO2021/078460
PCT Pub. Date: Apr. 29, 2021

(65) Prior Publication Data
US 2024/0126183 A1 Apr. 18, 2024

Related U.S. Application Data

(60) Provisional application No. 62/925,463, filed on Oct. 24, 2019.

(51) Int. Cl.
*G06F 30/30* (2020.01)
*G03F 7/00* (2006.01)
*G06F 30/392* (2020.01)

(52) U.S. Cl.
CPC .... *G03F 7/706839* (2023.05); *G03F 7/70441* (2013.01); *G03F 7/70625* (2013.01); *G06F 30/392* (2020.01)

(58) Field of Classification Search
CPC .......... G03F 7/706839; G03F 7/70441; G03F 7/70625; G06F 30/392
See application file for complete search history.

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

CN 106469234 3/2017
WO 2010059954 5/2010

OTHER PUBLICATIONS

International Search Report and Written Opinion issued in corresponding PCT Patent Application No. PCT/EP2020/076639, dated Jan. 27, 2021.
(Continued)

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

A method for generating a retargeted pattern for a target pattern to be printed on a substrate. The method includes obtaining (i) the target pattern comprising at least one feature, the at least one feature having geometry including a first dimension and a second dimension, and (ii) a plurality of biasing rules defined as a function of the first dimension, the second dimension, and a property associated with features of the target pattern within a measurement region; determining values of the property at a plurality of locations on the at least one feature of the target pattern, each location surrounded by the measurement region; selecting, from the plurality of biasing rules based on the values of the property, a sub-set of biases; and generating the retargeted pattern by
(Continued)

applying the selected sub-set of biases to the at least one feature of the target pattern.

20 Claims, 29 Drawing Sheets

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 8,200,468 | B2 | 6/2012 | Ye et al. |
| 8,255,838 | B2 * | 8/2012 | Xue .................. G03F 1/36 716/54 |
| 2008/0195996 | A1 | 8/2008 | Torres Robles et al. |
| 2010/0315614 | A1 | 12/2010 | Hansen |
| 2011/0202892 | A1 | 8/2011 | Lee et al. |
| 2014/0007024 | A1 | 1/2014 | Tsai et al. |
| 2017/0053058 | A1 * | 2/2017 | Yu ...................... G06F 30/398 |
| 2019/0094710 | A1 | 3/2019 | Wang et al. |
| 2019/0392110 | A1 * | 12/2019 | Huda .................. H10D 89/10 |

OTHER PUBLICATIONS

Taiwanese Office Action issued in corresponding Taiwanese Patent Application No. 109134894, dated Jun. 28, 2021.
Granik, Y.: "Source Optimization for Image Fidelity and Throughput", Journal of Microlithography, Microfabrication, Microsystems 3(4), pp. 509-522 (Oct. 2004).
Rosenbluth, A.E. et al.: "Optimum Mask and Source Patterns to Print a Given Shape", Journal of Microlithography, Microfabrication, Microsystems 1(1), pp. 13-20 (2002).
Socha, R. et al.: "Simultaneous Source Mask Optimization (SMO)", Proc. of SPIE, vol. 5853 (2005).
Nocedal, J. et al.: "Numerical Optimization", Second Edition, Berlin, New York: Vandenberghe. Cambridge University Press, Springer.
Lucas, K. et al.: "Process, Design, and OPC Requirements for the 65 nm Device Generation", Proc. of SPIE, vol. 5040 (2003).
Y. Cao et al., "Optimized Hardware and Software for Fast, Full Chip Simulation", Proc. of SPIE, vol. 5754 (2005).

* cited by examiner

| | $A<PR_1\leq B$ | $B<PR_1\leq C$ | $C<PR_1\leq D$ | $D<PR_1<E$ |
|---|---|---|---|---|
| $PR_1$ / $PR_2$ | | | | |
| $a<PR_2\leq b$ | Table1 | Table2 | Table3 | Table4 |
| $b<PR_2\leq c$ | Table5 | Table6 | Table7 | Table8 |
| $c<PR_2\leq d$ | Table9 | Table10 | Table11 | Table12 |
| $d<PR_2<e$ | Table13 | Table14 | Table15 | Table16 |

FIG. 4B

METHOD FOR RULE-BASED RETARGETING OF TARGET PATTERN

CROSS-REFERENCE TO RELATED APPLICATIONS

This application is the U.S. national phase entry of PCT Patent Application No. PCT/EP2020/076639 which was filed on Sep. 24, 2022, which claims the benefit of priority of U.S. Provisional Patent Application No. 62/925,463 which was filed on Oct. 24, 2019 and which is incorporated herein in its entirety by reference.

TECHNICAL FIELD

The description herein relates to lithographic apparatuses and patterning processes, and more particularly method for determining corrections for a target pattern to improve a patterning process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source). This process in which features with dimensions smaller than the classical resolution limit of a lithographic projection apparatus are printed, is commonly known as low-$k_1$ lithography, according to the resolution formula $CD = k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed— and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an embodiment, there is provided a method for generating a retargeted pattern for a target pattern to be printed on a substrate. The method includes obtaining (i) the target pattern comprising at least one feature, the at least one feature having geometry including a first dimension and a second dimension, and (ii) a plurality of biasing rules defined as a function of the first dimension, the second dimension, and a property associated with features of the target pattern within a measurement region; determining values of the property at a plurality of locations on the at least one feature of the target pattern, wherein each location is surrounded by the measurement region; selecting, from the plurality of biasing rules based on the values of the property, a sub-set of biases for the plurality of locations on the at least one feature; and generating the retargeted pattern for the target pattern by applying the selected sub-set of biases to the at least one feature of the target pattern.

Furthermore, in an embodiment, there is provided a method for determining biasing rules for a target pattern to be printed on a substrate. The method includes obtaining the target pattern comprising at least one feature defined by a first dimension and a second dimension; determining, via executing the process correction model, a plurality of biases for the first dimension and the second dimension, and associating each of the plurality of biases with a value of the property, wherein the process correction model biases the first dimension and the second dimension of the at least one feature, and computes the property associated with the at least one feature; and defining, based on the plurality of biases, the biasing rules as a function of the first dimension, the second dimension, and the property associated with the at least one feature.

Furthermore, there is provided a computer program product comprising a non-transitory
computer readable medium having instructions recorded thereon, the instructions when executed by a computer implementing the method of any of the above claims.

BRIEF DESCRIPTION OF THE DRAWINGS

Embodiments will now be described, by way of example only, with reference to the accompanying drawings in which:

FIGS. 4B and 4C illustrate example bias tables for a plurality of properties

Figure 1:
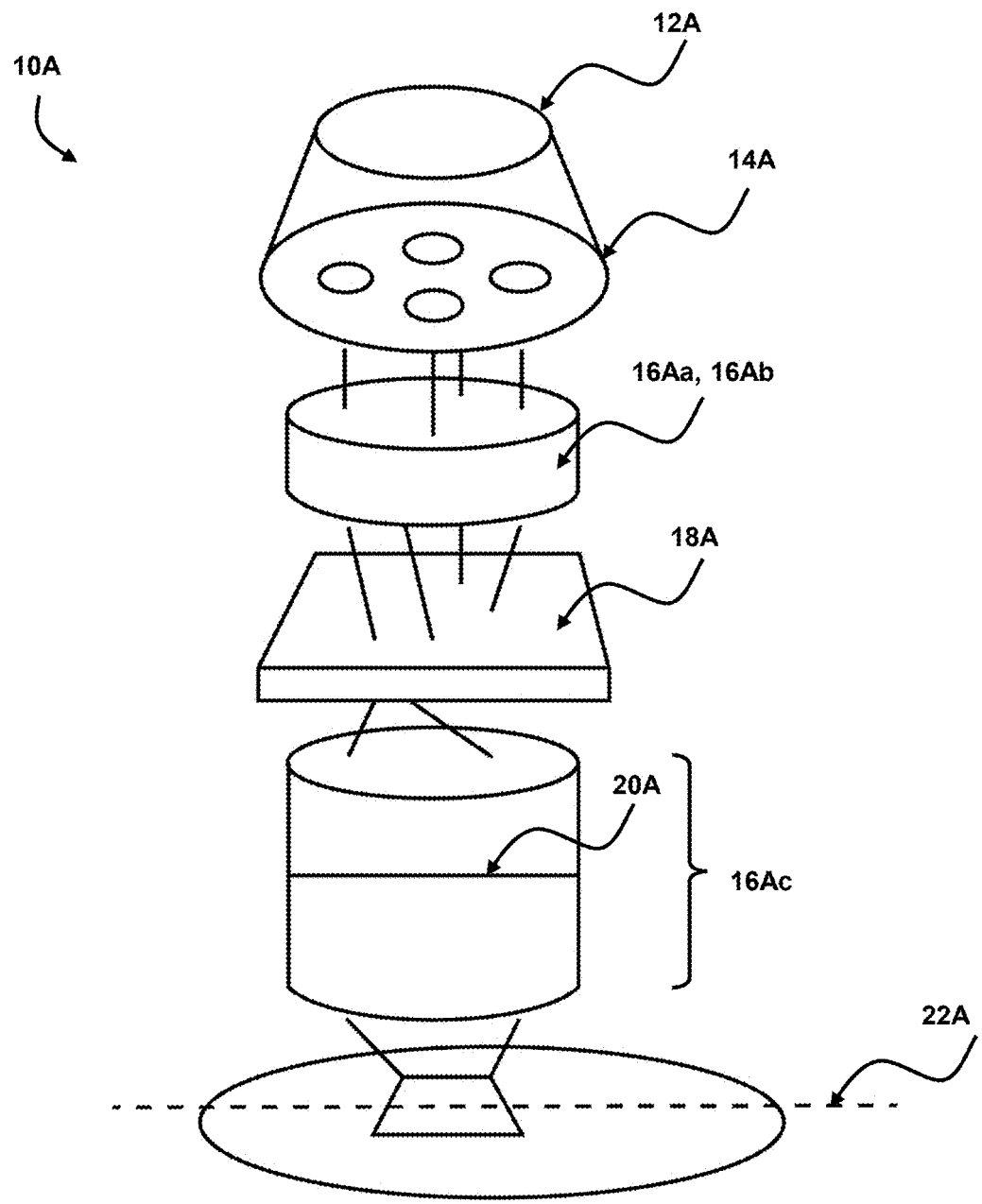
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
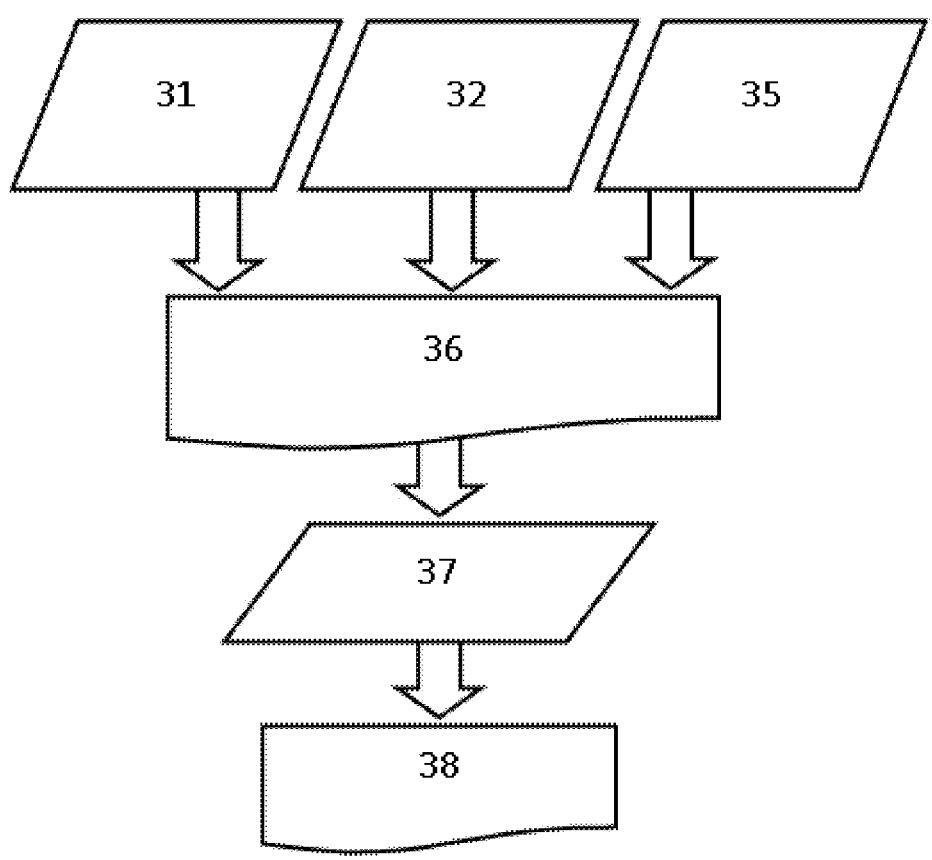
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587, 704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In order to improve the patterning process, several types of correction models may be employed to modifying the desired pattern to be printed on a substrate. Such modification of the desired pattern is referred as retargeting. Current methods related to modifying the desired pattern include rules-based retargeting and model based retargeting.

For example, improving process windows for specific features using rule-based modification, called "retargeting," to the pre-OPC layout. See K. Lucas et al., "Process, Design, and OPC Requirements for the 65 nm Device Generation," Proc. SPIE, Vol. 5040, pg. 408, 2003. One approach for rule-based retargeting of the pre-OPC layout includes selective biases and pattern shifts. This approach may improve the full process window performance for certain critical features, while still calculating OPC corrections only at nominal process condition, by selectively changing the target edge placements that the OPC software uses as the desired final result. Thus, instead of minimizing errors between the design dimensions and simulated edge placements, the OPC software instead minimizes errors between the retargeted dimensions and the simulated edge placements.

A user of the OPC software can retarget the design to improve the process window performance in a number of ways. In the simplest example of retargeting, rules can be applied to specific features to improve their printability and process window. For example, isolated lines have poorer process window latitude than dense lines, but the process margin improves as the feature size increases. A simple rule could be applied to upsize small isolated lines, thereby improving the process window. Other rule-based retargeting methods have been developed where metrics other than CD are used to determine the retargeted edge placements, such as normalized image log slope (NILS), sensitivity to mask CD errors, or Mask Error Enhancement Factor (MEEF)).

Rule-based retargeting methods can improve printability of features across the process window, but they suffer from several disadvantages. These methods can become quite complex and are only based on the pre-OPC layout. Once the OPC corrections are added to a design, the printing performance as a function of process conditions can become quite different from what was anticipated from the pre-OPC design, introducing a significant error source and preventing the retargeting from achieving the desired results. Thus, accuracy of printed features may be an issue. On the other hand, model based retargeting may generate more accurate results. However, model-based retargeting approaches suffer more on side of consistency, speed, interpretability and retargeting precise control.

The rule-based retargeting may be employed as it has certain advantages. For example, rule-based retargeting much faster compared to model-based approaches. The retargeted patterns are more consistent thereby easier to interpret e.g., why a circle design was modified a certain way. However, in the model-based approach, one need to understand and interpret what exactly the model was seeing and then why the design pattern is modified in a certain way.

Another advantage of the rules-based retargeting is complete control on how a particular pattern be modified. On the other hand, a model-based approach may employ a continuous function that will serve as an objective function based on which a design pattern is modified. So, if a process is not perfectly modeled by the model, then a user sometimes may tweak the bias manually so that model result match a desired printing performance on the wafer. However, such additional biasing can be difficult to do with models that have been calibrated already. On the other hand, with the rules-based retargeting, one can easily determine portions of a simulated pattern (e.g., generated by a process model) that deviates from desired pattern on the wafer. Then, rule-based tables can be used to bias those specific portions. In other words, no changes are made to a model behavior thus not affecting other design patterns, except for the pattern that are satisfy certain rules within the table. For a model-based approach, it is very difficult to do this because changes are made to the model itself. And, if the model is changed, then the behavior of the correction is also changed for other design pattern. For example, the design pattern that generate desired printing results may be unnecessarily modified.

Even, though rules-based retargeting has several advantages over model-based retargeting, the rule-based approach is currently limited to e.g., width and space based rules for specific features. Thus, with current rule-based approach, for same width and space, the biasing may be same. However, modifying edges of the feature differently than others may produce better printing performance, even if width and space of the feature is the same. Thus, currently, the rule-based approach is very limited in this regard. On the other hand, the model-based retargeting, provide such flexibility of modifying edges of the same features differently to generate more accurate printing results. But, as mentioned earlier, model-based methods are more computationally intensive, and manufacturing patterns can be more expensive. For example, the patterns generated using model-based retargeting are less consistent, may be curved, difficult to interpret, and difficult to obtain a surgical control on selecting an edge to be modified.

The method(s) described herein extend the existing rule-based regarding. The method herein provide advantages of both the rule-based retargeting as well as model-based regarding. The method herein offers a significant improvement in the rules-based retargeting accuracy (e.g., in terms of EPE or CD of printed features) and widely expands their ability in design pattern coverage. For example, the method herein maintains the current benefits of the rules-based retargeting such as speed, consistency, interpretability and retargeting precise control.

The method herein proposes a property determination of a desired feature within a desired pattern to be retargeted. The property provides additional information based on neighboring features around a feature of interest. Thus, extending the descriptive power of the rules beyond the width and space dimensions. The property provides more control and more accuracy in the retargeting. The method has many applications including, but not limited to, etch computations, OPC, resist process correction, post-OPC corrections, etc. The property provides additional descriptive power over the geometry power.

Figure 3A:
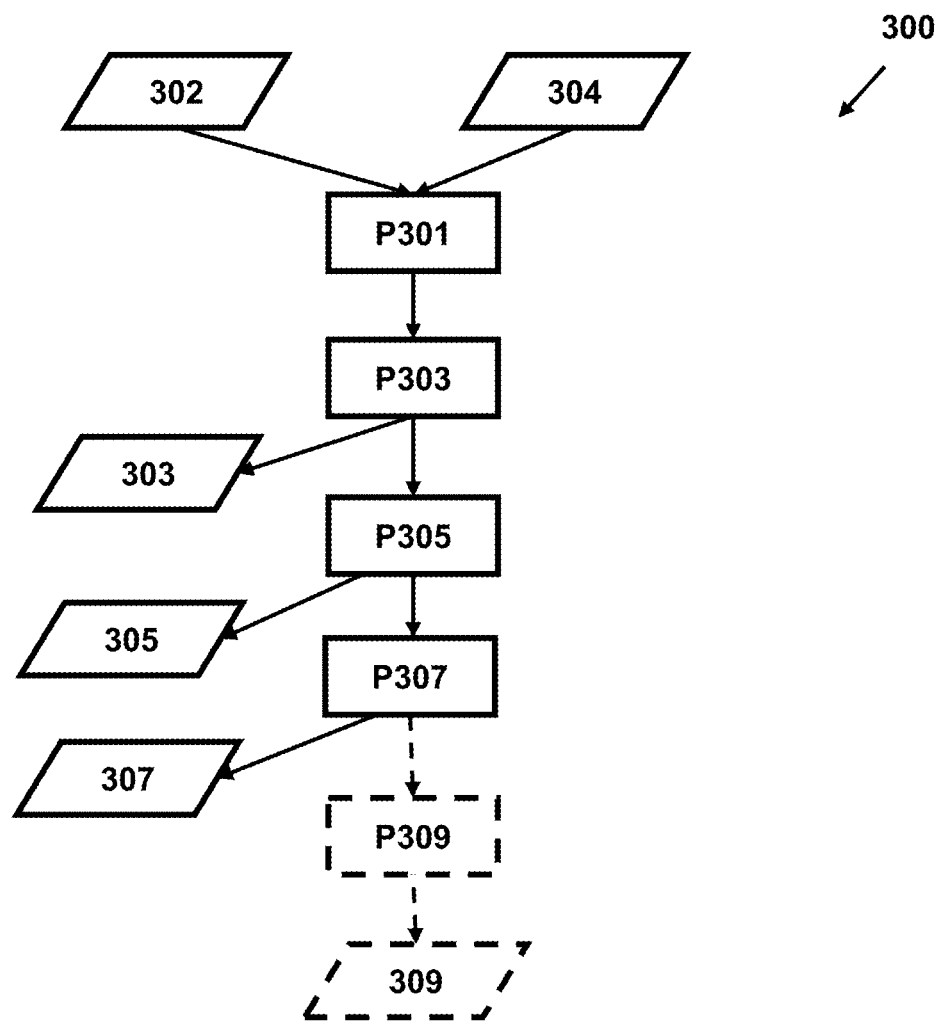
FIG. 3A is a flow chart of a method for generating a retargeted pattern for a target pattern to be imaged on a substrate, according to an embodiment.

FIG. 3A is a flow chart of a method 300 for generating a retargeted pattern for a target pattern to be imaged (e.g., optical image, and resist image), printed, (e.g., after development) or formed (e.g., after etching) on a substrate. In an embodiment, compared to the current rules-based methods, the proposed method 300 can significantly improve representation of rules, and describe patterns more accurately; eventually resulting in accurate printing of the patterns on the substrate. The method 300 still provide the main advantages of rule-based retargeting including speed, consistency, interpretability and control, while gaining a significant improvement in the accuracy domain, which has been the main advantage of a model-based retargeting. In an embodiment, the method 300 determines a property associated with a target feature or the target pattern to determine a retargeted feature or retargeted patterns. For example, the property can be a geometry-based density computation. The present disclosure is not limited to density. As discussed herein, the property may be computed using kernels (e.g., low pass filter), transformation functions (e.g., FFT or sinusoidal functions), or other operations on a given window. The method 300 includes following procedures.

Procedure P301 includes obtaining (i) the target pattern 301 comprising at least one feature, the at least one feature having geometry including a first dimension and a second dimension, and (ii) a plurality of biasing rules 304 defined as a function of the first dimension, the second dimension, and a property associated with features of the target pattern 301 within a measurement region.

In an embodiment, the target pattern 301 can be any desired pattern to be printed on the substrate. In an embodiment, the target pattern 301 is a design pattern, an after development image (ADI) pattern obtained after developing a resist image on the substrate, and/or an etch pattern obtained after applying an etching process to the ADI. In an embodiment, the design pattern can be provided in a GDS file format. The ADI pattern can be obtained via simulating (e.g., FIG. 2) one or more models (e.g., optics model, resist model, etc.) related to a patterning process. In an embodiment, the ADI can be obtained from metrology tools configured to measure an imaged substrate. Similarly, the etch pattern can be obtained via simulating (e.g., FIG. 2) one or more models (e.g., optics model, resist model, a etch model, etc.) related to the patterning process. In an embodiment, the ADI can be obtained from metrology tools configured to measure an imaged substrate. In an embodiment, the target pattern can be a design pattern related to memory (e.g., DRAM) circuit.

The target pattern 301 includes a plurality of features such as one or more bars, one or more lines, one or more contact holes, etc. In an embodiment, at least one feature (also referred as a target feature) can be characterized based on geometry of the feature. For example, the target feature has a first dimension and a second dimension. In an example, the first dimension is a width of the target feature, and the second dimension is a height or a length of the target feature, or a space between the target feature and a neighboring feature. For example, the space between two lines (e.g., space between features F10 and F20 in FIG. 5B). In an embodiment, curved features may be characterized by a radius of curvature. In an embodiment, the geometry of the feature may be described as ratio of dimensions (e.g., height/width) or a function of geometric dimension (e.g., an area, or a circumference). The dimensions- width and space, are used as examples to explain concepts and do not limit the scope of the present disclosure.

In an embodiment, the plurality of biasing rules 304 may be defined as a function of the first dimension (e.g., a width), the second dimension (e.g., a space between two features), and a property associated with features of the target pattern 301 within a measurement region. In an embodiment, the measurement region includes at least a portion of the target feature. In an embodiment, the measurement region may be user defined. In an embodiment, the measurement region can have any shape. For example, the measurement region can be a rectangular box, a square box (e.g., see R1 and R2 in FIG. 5A, boxes in FIGS. 10A and 10B), a circular shape (e.g., see FIGS. 11A and 11B), or other bounding box shapes. In an embodiment, the measurement region is movable across the target pattern.

In an embodiment, one property or a plurality of properties can be associated with features of the target pattern 301. For example, a first property can be determined using a first box of a first size (e.g., 100 nm×100 nm), and a second property can be determined using a second box of a second size (e.g., 300 nm×300 nm). In an embodiment, one property may be density and another property may be obtained using convolution of a kernel (e.g., low pass filter kernel) with the target pattern 301.

As an example, the property of the target feature is a density of feature within the measurement region, where the measurement region includes at least a portion of the target feature. In an embodiment, the density can be computed as a ratio of an area of features within the measurement region and a total area of the measurement region. In other words, the density represents a fraction of the measurement region covered by features. However, the present disclosure is not limited to the density property. In an embodiment, the property can be computed via convoluting a desired function or kernel (e.g., a low pass filter, sinusoidal function) with the target feature or features within the measurement region. In an embodiment, the density may be computed using a top hat function or a rectangular function convoluted with the region (including the target feature). Examples of the property related to a target feature and different ways to compute the property are discussed herein, e.g., with respect to FIGS. 4A-4C, 5A-5B, 10A-10B, and 11A-11B. Based on the property values at a location of the target feature, a plurality of biases may be applied to a target feature, even though the target feature has same width and space. For example, a first bias at a center of the target feature and a second bias at an end of the target feature.

In an embodiment, the plurality of biases are values (also referred as retarget values) used to modify the target pattern 301 to generate a retargeted pattern. In an embodiment, the retargeted pattern can be a mask pattern that includes OPC generated using biases according to the present disclosure. For example, a design pattern, including a feature of a particular width and space, can be modified by applying biases based on the property (e.g., the density). In an embodiment, the bias values can be determined based on simulation of a process correction model (e.g., etch process correction) of the patterning process, as discussed with respect to FIGS. 12 and 13.

Figure 4A:
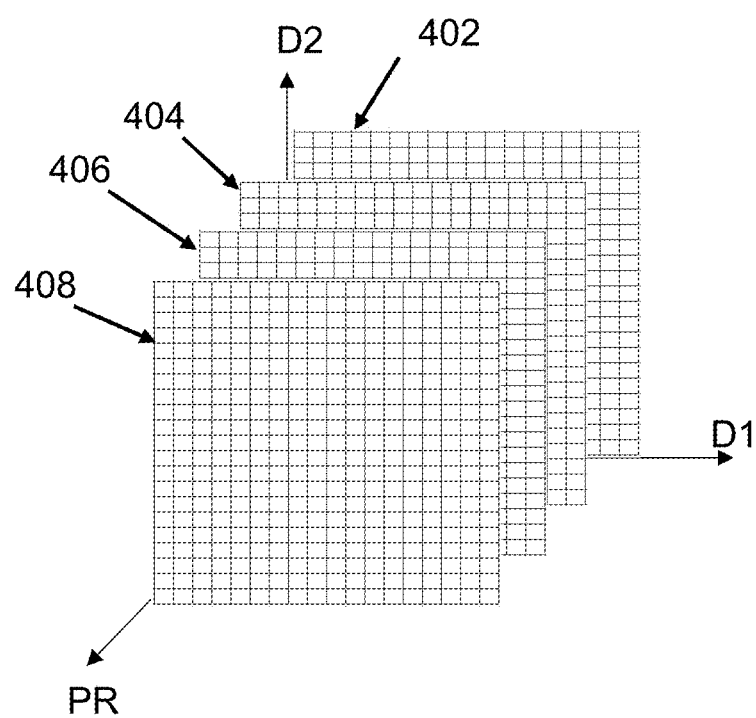
FIG. 4A illustrate example bias tables for a property, each cell of the tables include a bias value, according to an embodiment.
Figure 4C:
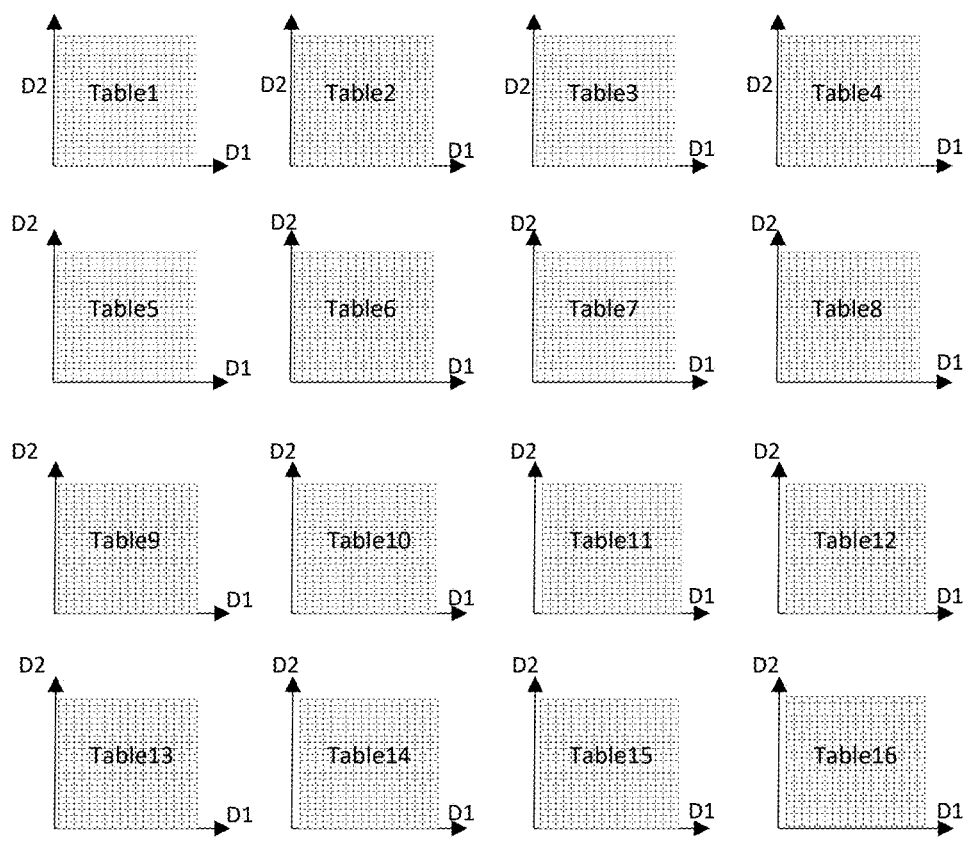

In an embodiment, referring to FIGS. 4A,-4C, the plurality of biases can be stored as a relationship tables. FIG. 4A illustrate example bias tables 402, 404, 406, and 408, each cell of the tables include a bias value (not shown). A bias table (e.g., 402) includes a set of bias values assigned according to a first dimension D1 (e.g., width) and a second dimension D2 (e.g., space) and a property PR1 (e.g., density) of the target pattern. For a particular value of the first dimension D1 and the second dimension D2, multiple bias values are available in tables 402, 404, 406 and 408, respectively, depending on the property value PR1. For example, for a target feature of width 65 nm and space 60 nm, a plurality of biases are available based on the density value associated with the feature to be retargeted. For example, for D1=65 and D2=60, if the density is 0.3, then a bias of 1 nm may be available in the table 404. In another example, for the same D1=65 and D2=60, if the density is 0.5, then a bias of 2 nm may be available in the table 406. For example, the density value may be different depending on a location in the target pattern at which the density is determined. For example, the density value at a center of a line (an example target feature) can be different from density value at a line end.

In an embodiment, a plurality of such bias tables can be defined for each feature type. For example, a plurality of bias tables may be defined for line-ends, contact holes, etc. In an embodiment, a property may be used for tagging a particular feature. For example, tagging a feature as a potential hot spot or a critical pattern. Thus, for tagging purposes, a property may be determined (e.g., as discussed herein), so that a table for line end, a table for space and width may be made available. Hence, a full generic table may not be defined that covers everything.

Referring to FIGS. 4B and 4C, in an embodiment, a plurality of properties may be determined for a single target feature. Then, depending on a range of values of the each property, a plurality of bias tables may be determined and stored. FIG. 4B is a table showing a plurality of bias tables based on a range of values of a properties PR1 and PR2. For example, the first property PR1 can be a first density computed using the first box (e.g., 100 nm×100 nm), and the second property PR2 can be a second density computed using the second box (e.g., 300 nm×300 nm). In an embodiment, minimum and maximum range of density can be from 0 to 1, where 0 indicates absence of a portion of the target feature is present in the box, and 1 indicates the entire box is filled with the target feature. Both the 0 and 1 density values may be undesirable, and optimum box sizes may be determined such that the density values range between 0.1 to 0.9; 0.3 to 0.8 or other desirable ranges. The present disclosure is not limited to a particular property nor a particular range of property values.

As shown in FIG. 4B, a Table1 can be used when a value of the first property PR1 in the range A to B, and the value of the second property PR2 in the range a to b. Similarly, for table Table1-Table16 can be used based on the values of PR1 and PR2. FIG. 4C illustrates example tables Table1-Table16 of FIG. 4B. In an embodiment, the table can be visualized as a grid and this grid is used to define for a particular width and space, what a biasing should be. As mentioned earlier, these table e.g., Table1, Table2, Table3, and so on, may have different bias information for same width and same space of a target feature because a density values are different around the target feature. For example, the density value at a center of a line (an example target feature) can be different from density value at a line end. So, around a given location of a target feature (e.g., a 10 nanometer line), if there are denser patterns in the neighborhood, then may be Table2 instead of Table1. The values of PR1 and/or PR2 can be computed based on the density of features in a measurement region, some kernels, or some other complicated functions. In an embodiment, density may be computed using a top hat function or a rectangular function convoluted with the features (including the feature of interest) within the measurement region.

In an embodiment, the table structure may be a starting point but it can be a general kernel (e.g., low pass filter) that can be used to create multiple tables depending on an outcome (e.g., range of values) of the kernel. For example, the outcome can be obtained by convoluting the kernel with features in an image of the measurement region.

In an embodiment, the plurality of biases can be determined using a model fitted as a function of the first dimension, the second dimension and the property.

Hence, a property or the plurality of properties are additional variables computed in addition to the width and space before a decision of retargeting a portion of the target pattern is made. In an embodiment, the selected biases for a given width and space are retarget values, each retarget value is for a portion of the at least one feature of the target pattern.

Procedure P303 includes determining values 303 of the property at a plurality of locations on the at least one feature of the target pattern 301, where each location is surrounded by the measurement region. An example flow chart of procedure P303 for determining values 303 of the property at a given location is shown in FIG. 3B.

Figure 3B:
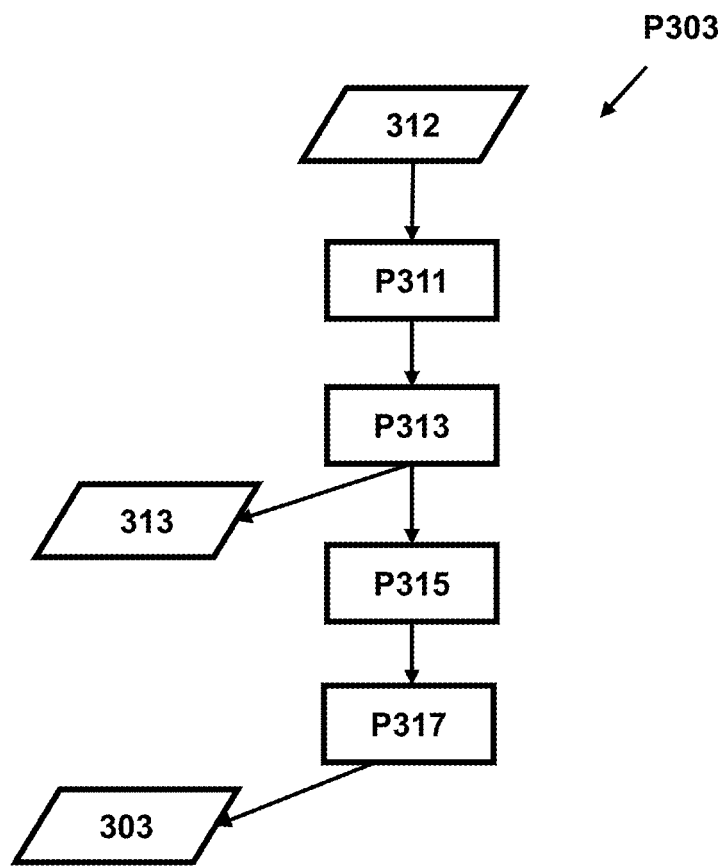
FIG. 3B is a flow chart of an example procedure for determining values of the property at a given location, according to an embodiment.

In FIG. 3B, procedure P311 includes assigning a measurement region around the given location at the at least one feature. In an embodiment, the measurement region includes at least a portion of the target feature. In an embodiment, the measurement region may be user defined. In an embodiment, the measurement region can have any shape. For example, the measurement region can be a rectangular box, a square box (e.g., see R1 and R2 in FIG. 5A, boxes in FIGS. 10A and 10B), a circular shape (e.g., see FIGS. 11A and 11B), or other bounding box shapes. In an embodiment, the measurement region is movable across the target pattern 301.

Procedure P313 includes identifying one or more features within the measurement region. In an embodiment, the one or more features refer to a portion of the one or more features. The one or more features may be a portion of a feature of interest or a feature adjacent to the feature of interest. For example, the feature of interest is a target feature that should be retargeted.

Procedure P315 includes calculating, via a user-defined function, a value of the property associated with the identified one or more features within the measurement region. For example, the user-defined function be a density. In an embodiment, the calculating of the density includes determining a total area of the identified one or more features within the defined area; determining a total area of the measurement region; and computing a density value as a ratio of the total area of features within the measurement region and the total area of the measurement region.

In an embodiment, the user-defined function is a geometric function, a signal processing function or an image processing function that transforms the one or more features within the measurement region into a characteristic value. The characteristic value is specific to the one or more features in the defined location. In an embodiment, the geometric function is a function of a shape, size, relatively position of the at least one feature of the target pattern 301. In an embodiment, the signal processing function is an image processing function, a sinusoidal function, cosine function, or a Fourier transform. In an embodiment, the image processing function is a low-pass filter, and/or an edge-detection function.

In an embodiment, the calculating of the value of the property includes applying convolution operation between the measurement region and the user-defined function (e.g., a low pass filter). In an embodiment, the measurement region is represented as an image comprising the one or more features, and the value of the property is calculated by convoluting the image with the user-defined function (e.g., the low pass filter).

In an embodiment, procedure P317 includes selecting another location at the at least one feature, and further performing steps P313, and P315 using the measurement region in P311 to determine the property values at different locations of the target pattern 301. In an embodiment, the locations can be a center of the target feature, an end of the target feature, or any other location at/near the target feature.

Figure 5A:
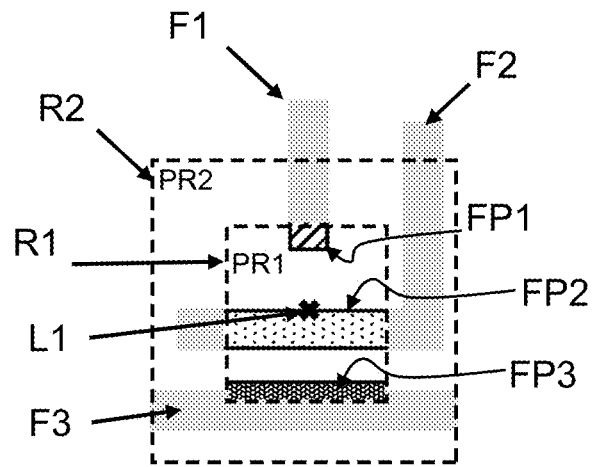
FIGS. 5A and 5B illustrate an example of determining the property for a given location of a target pattern, according to an embodiment.
Figure 5B:
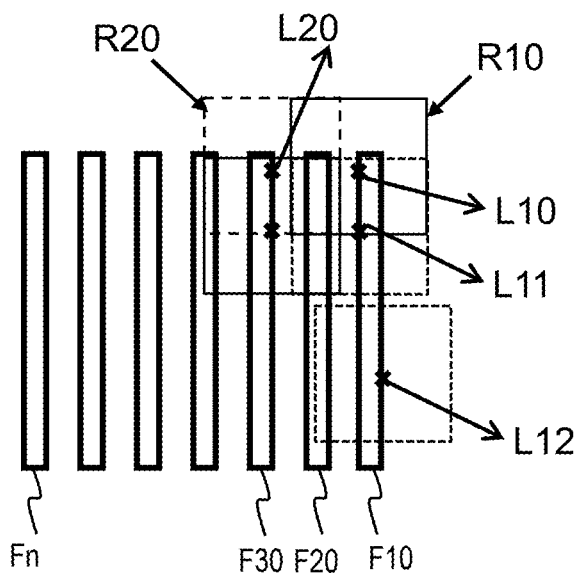

FIGS. 5A and 5B illustrates an example of determining a property at a location of a target pattern. Referring to FIG. 5A, the target pattern includes a plurality of features F1, F2, and F3. The property is determined at a location L1 associated with the feature F2 having a given width and space, therewith. In an embodiment, a first property PR1 is determined based on a first region R1 defined around the location L1. A second property PR2 can be determined based on a second region R2 defined around the location L1, where the second region R2 is larger than the first region R1. Hence, depending on the region R1 or R2, the target pattern will have two different property values for the same location L1. In an embodiment, the property PR1 or PR2 can be density.

In an embodiment, the first region R1 includes a portions FP1, FP2, and FP3 of the features F1, F2, and F3, respectively. Then, the first property PR1 (e.g., density) can be determined using areas of portions FP1, FP2, and FP3 divided by a total area of the first region R1. In embodiment, the property value at the location L1 using the first region R1 can be 0.35. Similarly, the second property PR2 can be determined as a total area of portions of features F1, F2 and F2 within the region PR2 divided by the total area of the second region R2. In an embodiment, the second property value PR2 can be 0.5. Thus, the location L1 associated with a given target feature has two different values 0.35 and 0.5 although the target feature F2 has a same width and space along the length of the feature. Thus, the property PR1 or PR2 provides additional information based on which the target feature to be modified or retargeted.

As mentioned earlier, the property is not limited to density. In an embodiment, the property may be computed by convoluting a kernel or a user-defined function with the target pattern (e.g., 301) or a portion of the target pattern (e.g., 301) within the measurement region. In an embodiment, application of kernels can be different than using multiple regions (e.g., each region defined at a different location). For example, kernels may be applied on a single location (e.g., L1) covering all the features (e.g., F1, F2, F3) within a single window. But property values can be obtained at various locations on the target feature (e.g., F2). For example, a Fourier Transform (FT) or Fast Fourier Transform (FFT) may be applied over all the features. The resulting coefficients of the FFT or frequency terms of the FFT can be property values.

In another example, a sinusoidal function can be applied in a y-dimension and/or x-dimension. In an example, the target feature (e.g., F3) is a horizontal polygon having an edge along a horizontal (x-direction), then the portion around the horizontal edge will have a strong signal in the first order sinusoidal along the "y" axis, while other locations will generate a weak signal. Such weak signal regions can be potential regions where the target pattern can be modified. In an embodiment, density may be computed using a top hat function or a rectangular function convoluted with the region (including the feature of interest) within the measurement region (e.g., R1).

As discussed herein, the measurement region is not even limited to a fully surrounding window (or box) around a given location. A window can be chosen in any sophisticated way and the density computation can be directional (outer vs inner) or computing each or multiple quadrant separately. The window can also be concentric rings or rings sectors, etc. In an embodiment, the measurement region is also referred as a window or a bounding box, herein.

FIG. 5B illustrates that property values associated with target feature change as the point of interests (e.g., locations at a target feature) change. In an embodiment, as the location on the target pattern change, the window also moves e.g., keeping the point of interest at the center of the window. Accordingly, the density at each location can change. Thus, changing the location on the target pattern can provide a freedom to change the biasing for each of locations at the target feature.

In the example of FIG. 5B, the target pattern includes N-target features F10, F20, . . . , Fn. At each target feature, a plurality of locations can be chosen and the property value (e.g., density) can be computed at each location. In an embodiment, the locations can be chosen at a regular interval or randomly placed. For example, locations L10, L11 and L12 are chosen at a certain distance along the target feature F10. Further, measurement regions (or windows) R10, R11, and R12 are assigned to each location L10, L11, and L12, respectively, such that the location is at the center of a window. In an embodiment, each window is of same size, e.g., 100 nm×100 nm. Then, for each location L10, L11, and L12, density values may be computed based on the portions of the features F10, F20, and/or F30 within the respective measurement region R10, R11, or R12.

Based on the computed density values, biasing selected for each location L10, L11, and L12 may be different. Thus, the present method provides more flexibility in biasing differently at different location of the target feature compared to the existing rule-based methods. For example, the existing rule-based method may recommend the same biasing value at different locations since the space and width of the target feature is the same at such locations (e.g., L10, L11, and L12). Furthermore, the present method provides results comparable to a model-based biasing, since model-based biasing may recommend different biasing at different locations. Note, the present method selects biasing from tables based on certain rules, and does not execute a process correction model. Hence, the method provides advantages of both rule-based retargeting as well as model-based retargeting.

Procedure P305 includes selecting, from the plurality of biasing rules 304 based on the values of the property, a sub-set of biases 305 for the plurality of locations on the at least one feature. In an embodiment, the biasing rules are represented as a table of the first dimension and the second dimension for each of the property. In an embodiment, e.g., referring to FIG. 4B, the selecting of biases includes identifying a range in which a given value of the property belongs; selecting, for the identified range of the property, a biasing rule from the plurality of biasing rules 304; and selecting, from the biasing rule, a bias value associated with the given location of the plurality of locations on the at least one feature for a given values of the first dimension and the second dimension.

In an embodiment, each bias of the plurality of biases is at least one of: an etch compensation to be applied to an ADI pattern so that an etch pattern is within the desired specification; a model-error compensation associated with one or more process models used for simulating a patterning process; a mask proximity correction to be applied to a design layout to reduce variations in the target pattern, the variations being caused due to mask manufacturing; or an initial OPC biases to be applied to the design layout to generate an initial retargeted layout for optimal proximity corrections.

Further, procedure P307 includes generating the retargeted pattern 307 for the target pattern 301 by applying the selected sub-set of biases 305 to the at least one feature of the target pattern.

In an embodiment, the method 300 further includes, in procedure P309, applying each retarget value to the corresponding edge to generate the retargeted pattern; and applying optical proximity corrections to the retargeted pattern to produce a post-OPC pattern 309.

Figure 6A:
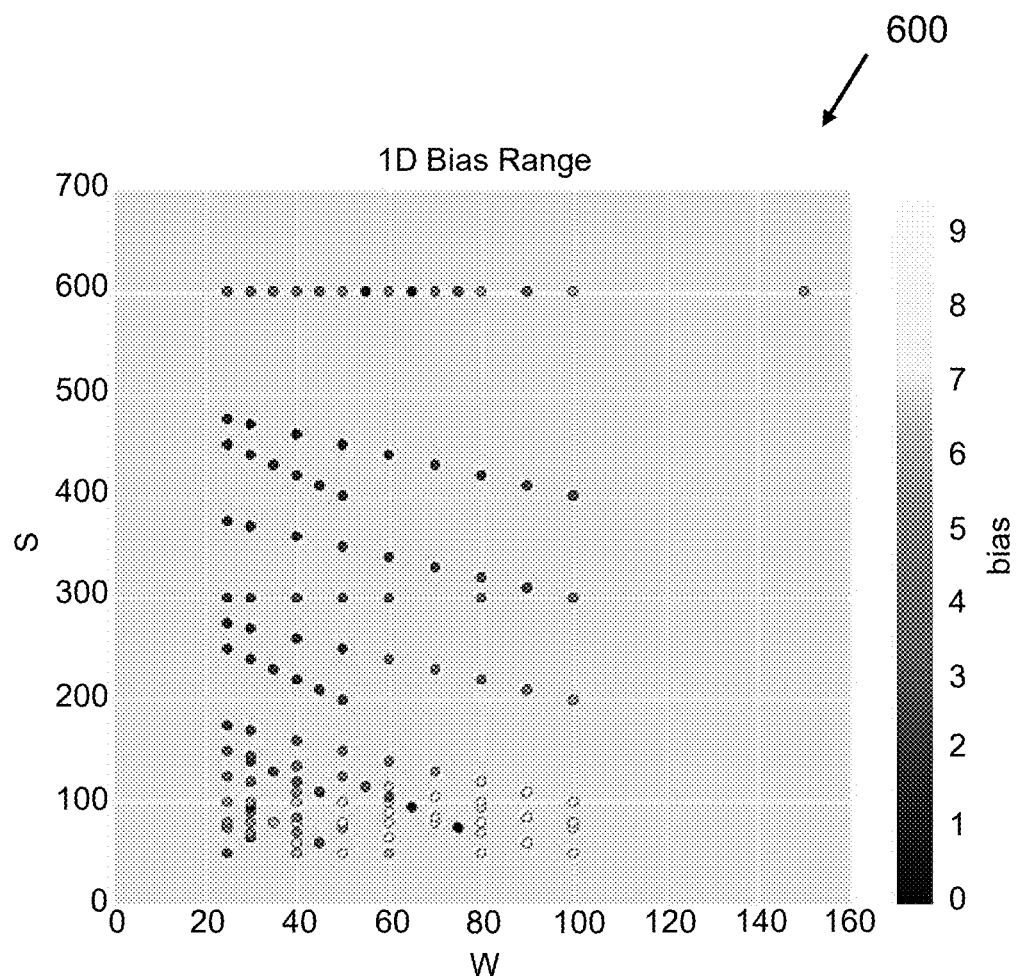
FIG. 6A is an example bias range according to an existing rule-based method, according to an embodiment.

FIG. 6A-7B illustrate example results of the present method. FIG. 6A illustrates an example of existing biasing plot 600 showing biasing values associated with dimensions space and width. In the plot, X-axis is an example range of widths in target pattern, and Y-axis is an example range of spaces in the target pattern. The color or grey scale here represents a range of bias slope. As shown, for the same width and space if the points has a bright color (e.g., white), then it means a target feature having almost same width and space may have bias values anywhere from 0 to 9 nm of difference. For example, a width of 100 nm and the space of 100 nm has more than 9 nm differences and this is cannot be explained based on only the width and space combination. So, for the same width and space one cannot define using an only width space table a proper bias. However, according to the method herein, using an additional variable (e.g., the property) one can define a plurality of biases for the same width and same.

Figure 6B:
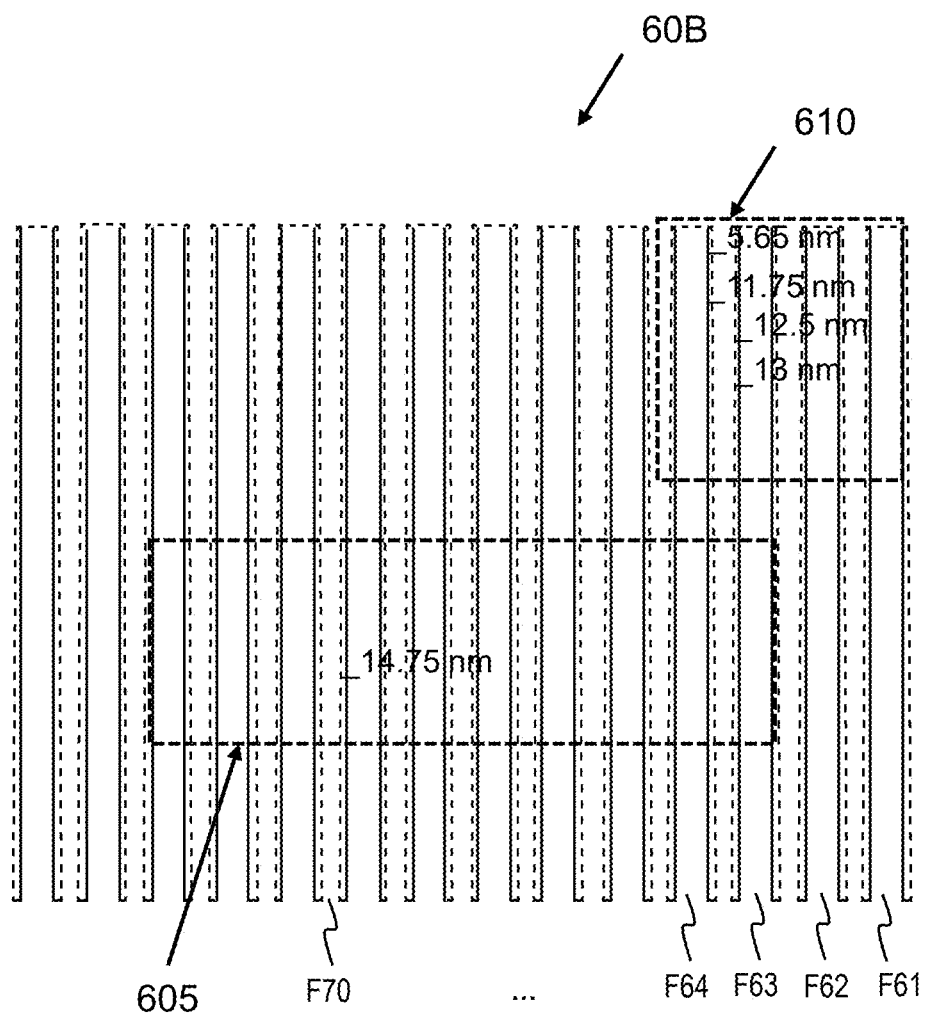
FIGS. 6B and 6C illustrate example biasing based on the property of a feature within an array of lines, according to an embodiment.
Figure 6C:
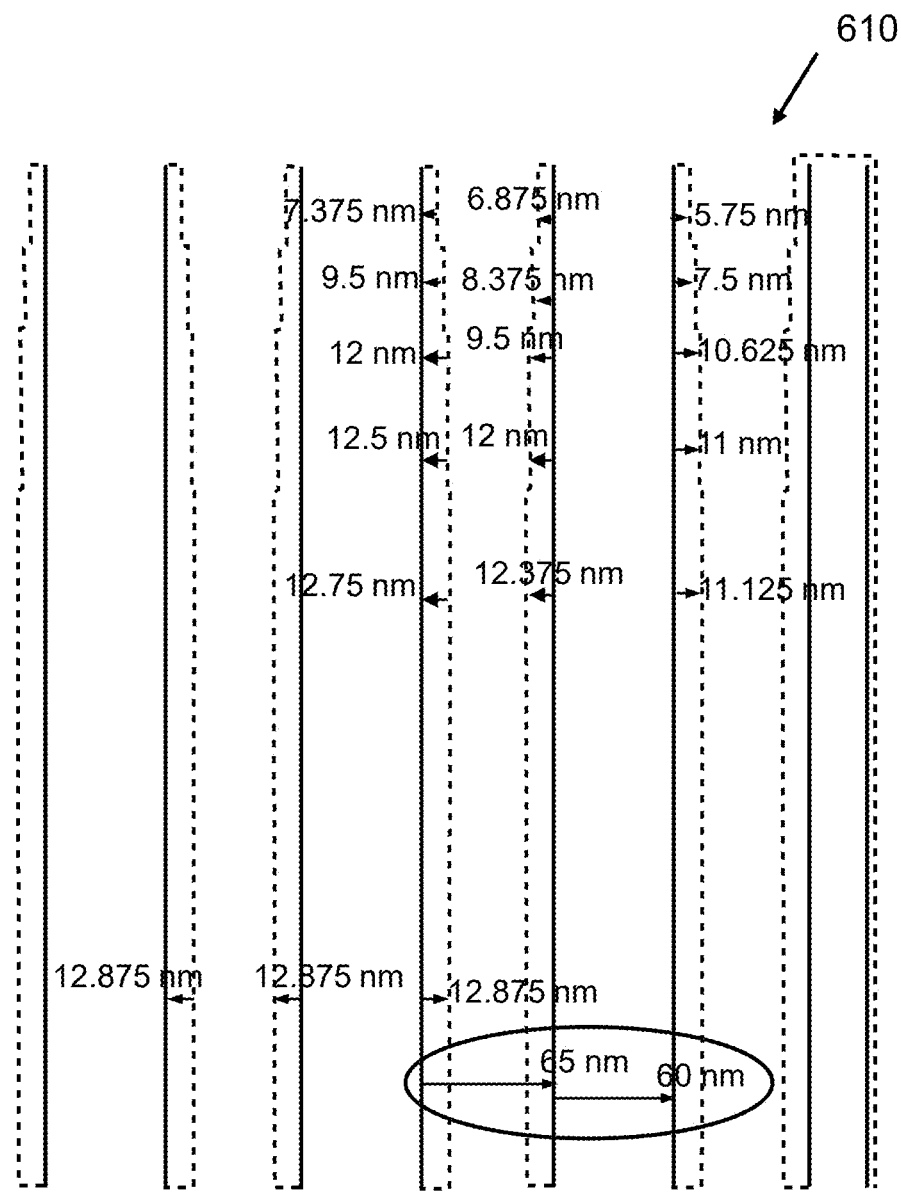

FIGS. 6B and 6C is an example result of applying biases according to the method discussed herein. FIG. 6B shows an example target pattern 60B including an array of features F61, F62, F63, . . . F70 and so on. In the target pattern 60B each feature is associated with a width 60 nm and space 65 nm. The array of features include different biases at different locations that can be applied to the target features to generate a retargeted pattern (dotted lines around the target features). In an example, at a center (e.g., feature portions at 605) of the array, a bias is approximately 14.74 nm, while towards an end of the line (e.g., portions at 610) the biases are smaller. In an embodiment, the density decreases when moved from the center (e.g., 605) towards an end (e.g., 610) so some locations have biases of 5 nm, 6 nm, and 5.2 nm. A magnified version of the end potions 610 are shown in FIG. 6C for better understanding of the different biases. So even though the target features have the same width and space, because the density varies different biases can be assigned.

Compared to existing rule-based methods, a user may assign same bias values for the same width and space. For example, for width 60 nm and space 65 nm, the bias value may be 14.75 nm. But, if the bias 14.75 nm is applied, then there may be over correcting or over biasing near a line end (e.g., at 610). In another example, if a smaller bias value e.g., 6 nm is used, there may be under-biasing at the center (e.g., at 605).

On the other hand, the present methods provide more descriptive power related to the target pattern (e.g., 60B) compared to using only the width and space. For example, the property (e.g., density) serves as an additional information that allows biasing differently for same width and space of the target pattern. For example, the portions of feature in 605 are biased differently than portions of features in 610. In an embodiment, in FIG. 6C, the difference between the dotted lines and features indicate how much movement of the target feature is performed. For example, the difference can be 7 nm or 8 nm. FIG. 6B also show, that at a center of the array 610, bias values are 12.875 nm and as one moves closer and closer towards the line ends the biases values are 5.75 nm. Such biasing information can be unfolded by considering property such as density.

Figure 7A:
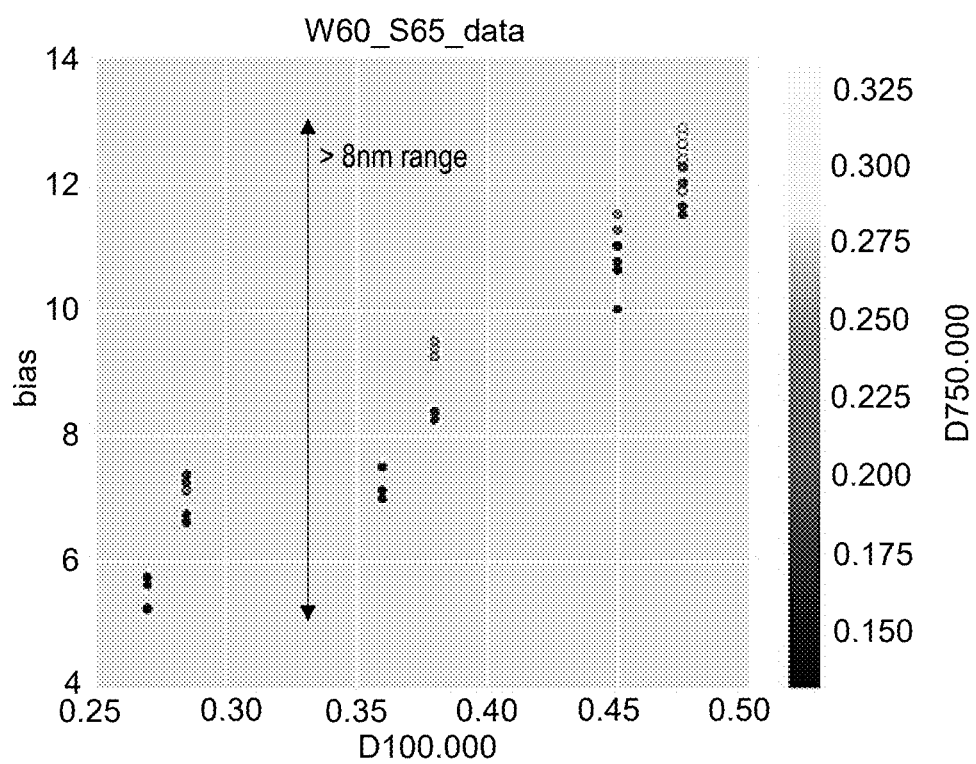
FIG. 7A is an example range of biases described using a first property and the second property, according to an embodiment.
Figure 7B:
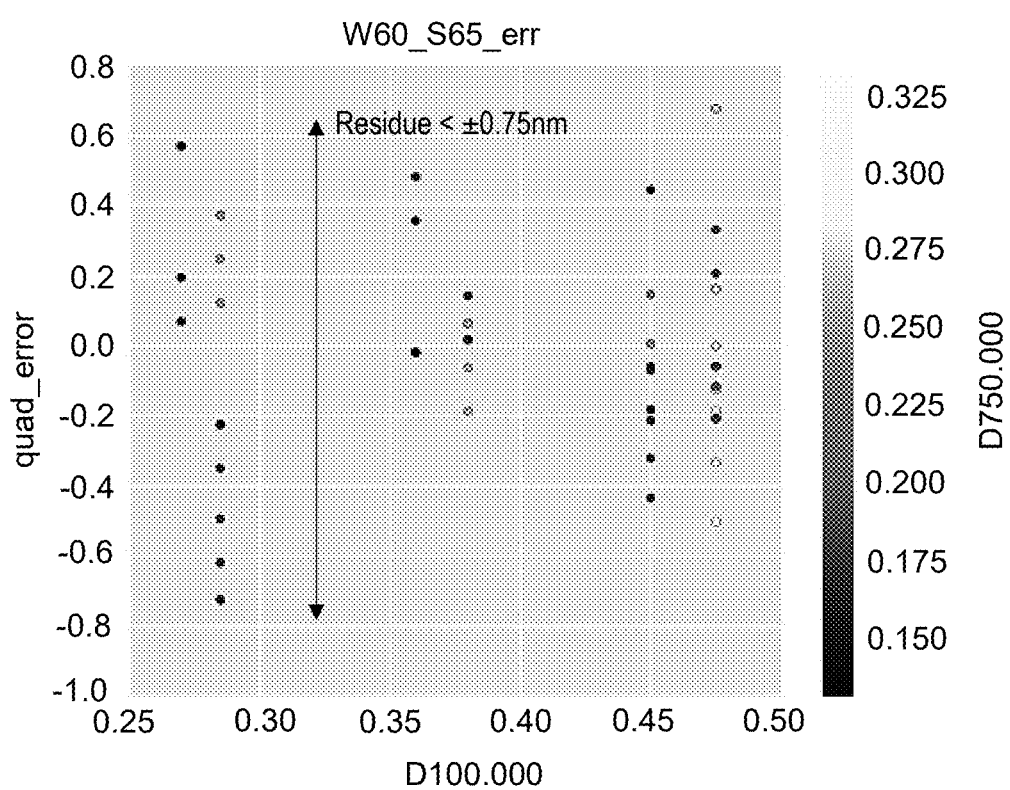
FIG. 7B is a residue of a model after applying biases according to FIG. 7A

As mentioned earlier, a plurality of properties e.g., a first property D100 and a second property D750 may be determined and biases can be defined as a function of the first property (e.g., D100 indicative of 100 nm2 measurement region) and the second property (e.g., D750 indicative of 750 nm2 measurement region). In an embodiment, the D100 is a small window and D750 is a relatively large window. A small window size allow to capture a small range effects of neighboring features, and larger window allows capturing of a large range effect of neighboring features. FIG. 7A shows biases as a function of properties D100 and D750. FIG. 7B shows error data associated with the biases of FIG. 7A. In an embodiment, the error data shows a significant improvement in residue related to a correction model associated with a patterning process.

In the plot of FIGS. 7A and 7B, for space 65 nm and width 60 nm, x-axis shows density values computed using D100 measurement region, y-axis shows the bias values, and the color gradient indicates density values computed using D750 measurement region. For example, 0.35 indicates 35% or 35 nm2 of 100 nm2 (e.g., D100) window is covered by polygon or target features and the rest of D100 window is empty, value 0.6 indicates 60% or 60 nm2 within the 100 nm2 window is covered by target features.

FIG. 7A shows that a linear behavior in assigning the bias values. In other words, as density of D100 increases bias values also increase. A similar linear behavior can be seen based on a color gradation indicating density of D750. In other words, as the density increases the bias values increases. The plot demonstrates that the property (e.g., density) is able to describe, unfold the bias information related to the same width and space in the different property. FIG. 7A shows 8 nm bias range. In an embodiment, a linear regression may be fitted based on the bias values and the property values. FIG. 7B shows a 2nd order polynomial error of the fitted model. The error is in the range ±0.75 nm or less, which is very small compared to existing rule-based methods. In an embodiment, the existing rule-based method, where the bias can be a constant 14.75 nm, may generate an error of up to 8 nm. In other words, with dimensions D100 and/or D750, can have large descriptive power that allows to go from an 8 nm error range or like bias range mix to less than 0.75 nm.

It can be understood by a person skilled in the art that the methods described herein, e.g., the method 300, are not limited a particular pattern or a property associated therewith. The method 300 can work for any type of pattern. For example, FIGS. 8A and 8B show biasing for line ends and FIG. 9 show biasing for contact holes.

Figure 8A:
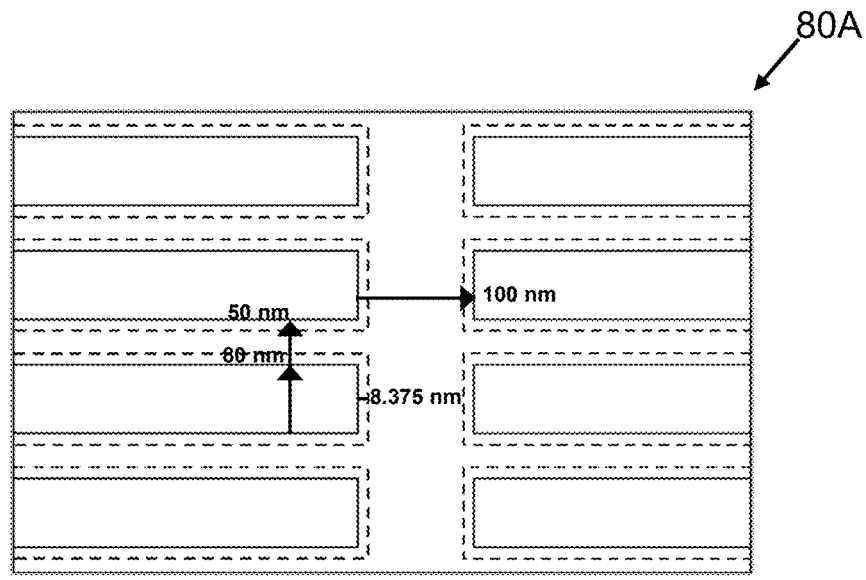
FIGS. 8A and 8B illustrate example biases for line ends, according to an embodiment.
Figure 8B:
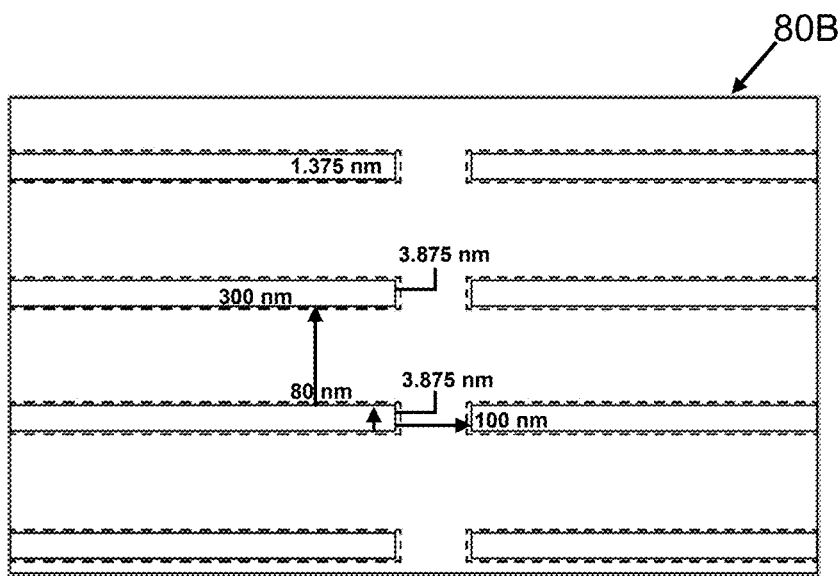
Figure 9:
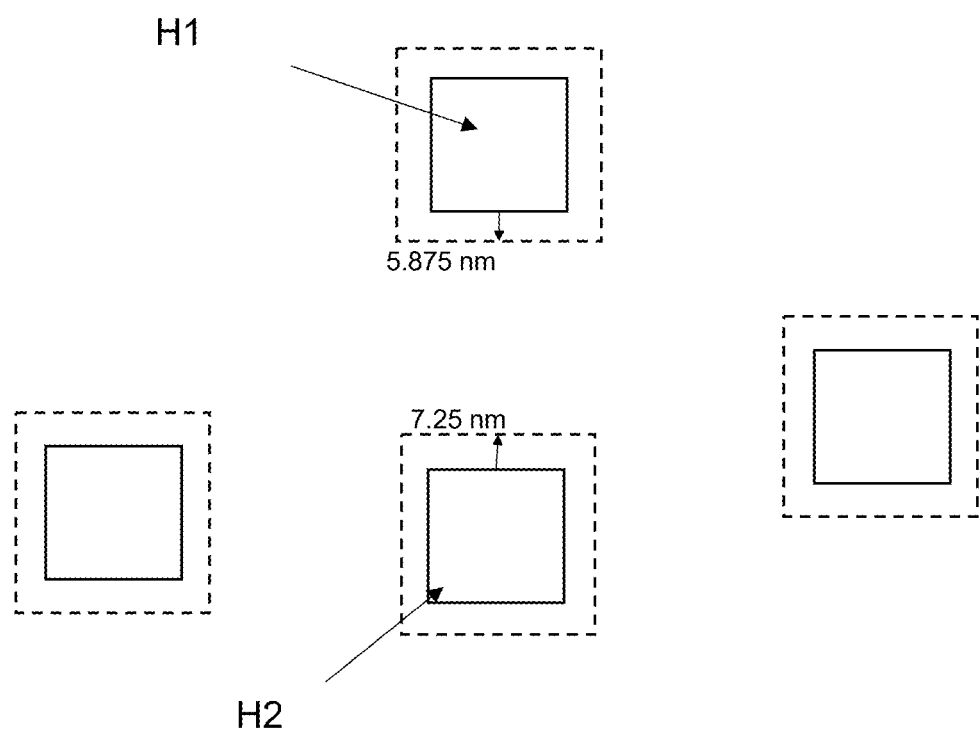
FIG. 9 illustrates an example pattern including contact holes and corresponding biases for each hole, according to an embodiment.

Referring to FIGS. 8A and 8B, line ends are usually described in terms of a width and a tip-to-tip space. As shown, the two target patterns 80A and 80B have same width and space, but the density will be different. Hence, in the target pattern 80A, the line ends may be moved by 8.375 nm. In the target pattern 80B, the line ends may be moved by 3.875 nm. Similarly, referring to FIG. 9, the contact holes H1 and H2 have same first dimension (e.g., diameter) and spacing, different biasing values e.g., 5.875 nm and 7.25 nm may be assigned via model-based corrections. Such biasing values can be explained by density values associated with the respective target features.

Figure 10A:
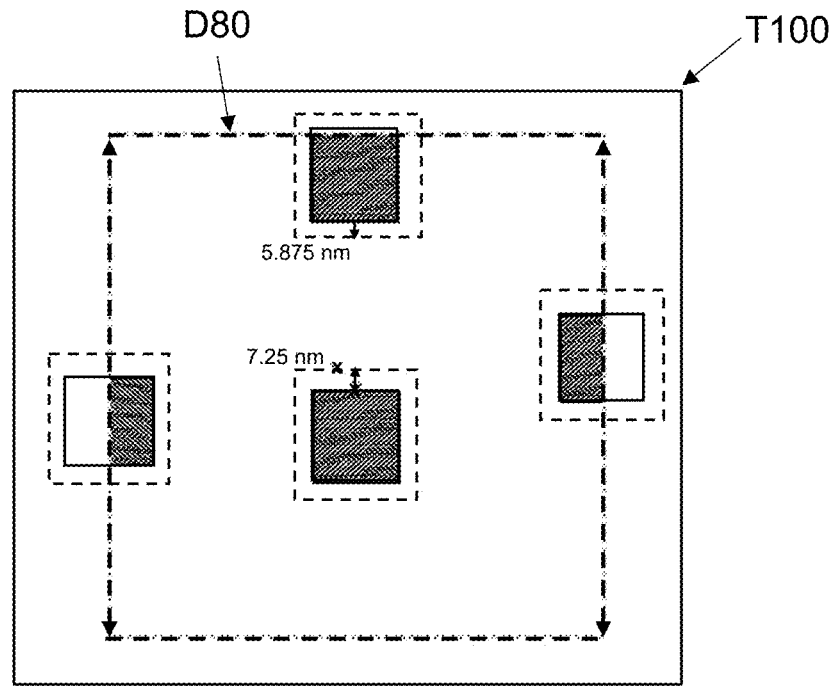
FIGS. 10A and 10B illustrate example density computation using a square window, according to an embodiment.

Furthermore, as discussed herein, the method 300 is not limited to a particular measurement region or window. FIGS. 10A/10B and 11A/11B explain use of different window shapes. FIGS. 10A-10B and 11A-11B illustrate a target pattern T100 and different window shapes. In an embodiment, the target pattern T100 includes four contact holes having same size, but different biases may be applied to each hole.

Figure 10B:
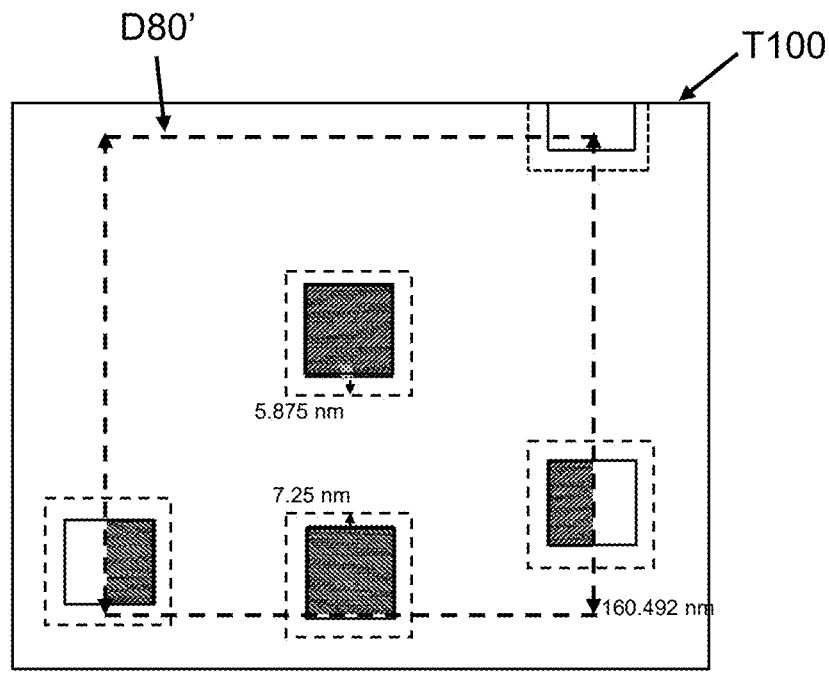

FIGS. 10A and 10B demonstrate that two square box D80 and D80' having same measurement area (e.g., 80 nm2) may not be appropriate for capturing the density values. For example, the D80 box is used to determine a first density value at a first location of a target pattern T100. The D80' box is used to determine a second density value at a second location of the target pattern T100. However, the features within each of the D80 and D80' have same exact area (e.g., area of the shaded region), but at least two contact holes have different biases e.g., 7.25 nm and 5.875 nm. As the densities are the same, the boxes D80 and D80' may not be appropriate to distinguish between the bias values. In an embodiment, a different size window or a different shape of the window may be more helpful. Hence, in an embodiment, a circular window may be used.

Figure 11A:
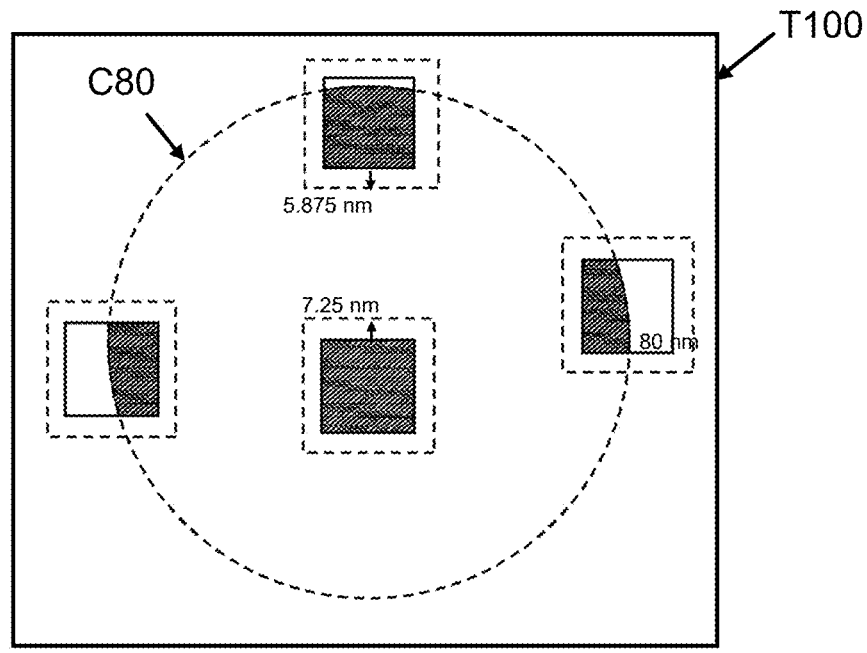
FIGS. 11A and 11B illustrate example density computation using a circular window, according to an embodiment.
Figure 11B:
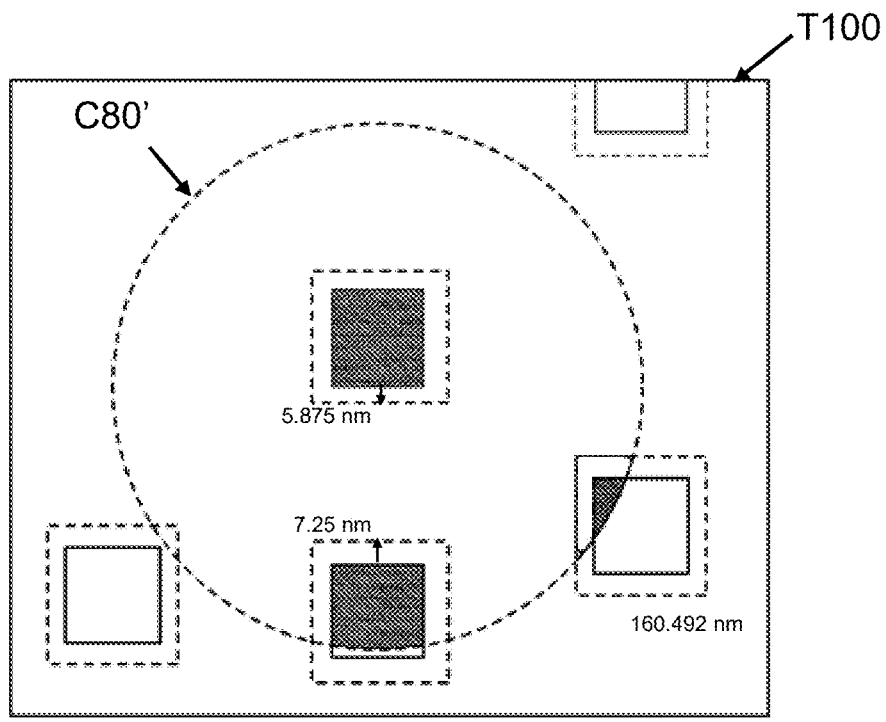

FIGS. 11A and 11B demonstrate, for the pattern T100, a circular window appears to have a difference in densities. For example, when a circular window C80 (e.g., having a diameter of 80 nm) is employed at a first location, a first density values is determined. When the circular window C80' (e.g., having the same diameter of 80 nm) is employed at the second location, a second density value is determined. These first and the second density values are different. Hence, such circular window C80 may be more appropriate than a square window D80. For example, the second density obtained using the circular window C80' is lower than the first density. Hence, based on C80', for example, a lower bias (e.g., 5.875) may be applied a contact hole compared to the bias value (e.g., 7.25) of a contact hole in the circular window C80 of FIG. 11B.

Figure 12:
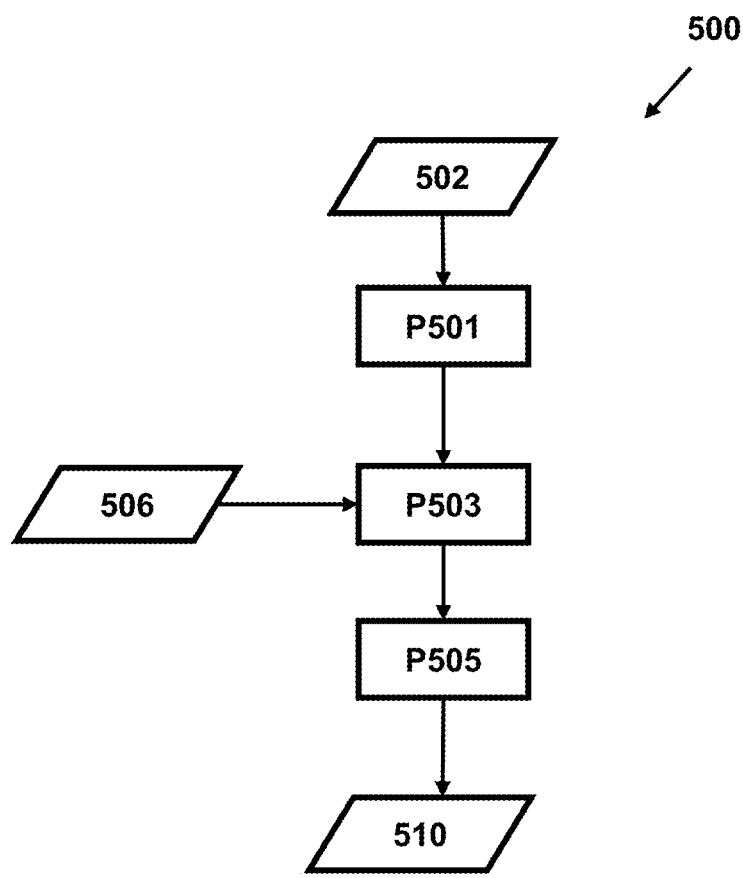
FIG. 12 is a flow of a method for determining biasing rules for a target pattern to be printed on a substrate, according to an embodiment.

FIG. 12 is a flow chart of a method 500 for determining biasing rules for a target pattern to be printed on a substrate. In an embodiment, model-based correction (e.g., etch correction) are used as ground truth for determining the biasing tables. For example, biases are collected per segment during model-based etch correction. For example, width, space, and densities per box size are calculated for every segment during model-based etch correction. The method includes procedures explained as follows.

Procedure P501 includes obtaining the target pattern 502 comprising at least one feature characterized by a first dimension and a second dimension. For example, the first dimension is the width and the second dimension is the space. In an embodiment, the space and width are related to a plurality of features in the target pattern 502 may be obtained.

Procedure P503 includes determining, via executing a process correction model 506, a plurality of biases for the first dimension (e.g., width) and the second dimension (e.g., space). Further, the procedure P503 includes associating each of the plurality of biases with a value of the property. In an embodiment, the process correction model 506 biases the first dimension and the second dimension of the at least one feature of the target pattern 502. Furthermore, a correction process employing the process correction model 506 is configured to compute the property associated with the at least one feature. For example, an etch correction model 506 may include a code implementing the computation of the property or a plurality of properties per location of a target pattern. Example computation of the property e.g., density is discussed herein e.g., with respect to FIGS. 5A and 5B.

In an embodiment, the determining of the plurality of biases includes generating, via executing the process correction model 506 using the target pattern 502, a retargeted pattern comprising biases for the first dimension and the second dimension of the at least one pattern; determining a difference between the retargeted pattern and the target pattern 506; and determining, based on the difference, the plurality of biases at the plurality of locations of the target pattern.

In an embodiment, the executing of the process correction model 506 comprises determining a plurality of values of the property for a plurality of locations on the at least one pattern of the target pattern. Examples of computing property values are discussed with respect to FIGS. 5A and 5B, and FIG. 13.

In an embodiment, the determining of the values of the property includes (a) assigning a measurement region around a given location on the at least feature; (b) identifying one or more features within the measurement region; (c) calculating, via a user-defined function, a value of the property associated with the identified one or more features within the measurement region; and (d) selecting another location on the at least one feature, and performing steps (b), and (c) using the measurement region in (a).

In an embodiment, the plurality of biases are collected per segment (or edge) of the target pattern 502 during execution of the process correction model, a segment is a portion of the target pattern 502.

In an embodiment, the value of the property is calculated per measurement region per segment of the target pattern 502 during execution of the process correction model, the measurement region is a region (or a window) around a given location of the target pattern 502.

Procedure P505 includes defining, based on the plurality of biases, the biasing rules 510 as a function of the first dimension, the second dimension, and the property associated with the at least one feature of the target pattern 502. In an embodiment, the defining of the biasing rules 510 includes defining, based on the values of the property, ranges for the property; and assigning, for each range of the property, a set of biases from the plurality of biases. In an embodiment, each bias of the set of bias is associated with the first dimension and the second dimension.

The present method is not limited to a particular process model 506. As an example, the process correction model 506 is at least one of: an etch correction model that determines corrections to a etched pattern associated with the target pattern; an optical proximity correction model that determines modifications to the target pattern; or a mask proximity correction model that determines corrections associated with mask manufacturing process.

Figure 13:
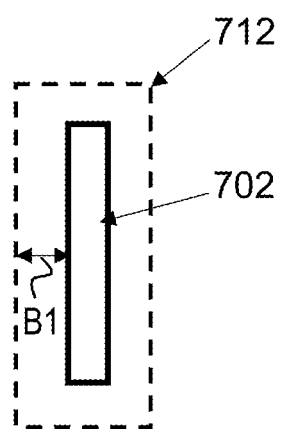
FIG. 13 is an example bias determined using an etch correction model, according to an embodiment.

FIG. 13 illustrates an example of determining a etch bias based on an etch pattern. In an embodiment, an etch correction model may be executed to determine corrections to an etched pattern. In an embodiment, an etch feature 702 is a target feature desired to be printed/etched on a substrate. In an embodiment, the etch feature 702 can be obtained via an etch process model configured to generate a etch profile from a design pattern, a resist image, or an after development image (ADI). In an embodiment, the etch feature 702 can be extracted from a SEM image of an etched substrate. The etch feature 702 is used as an input to the etch correction model to generate an input pattern (e.g., a retargeted etch pattern) to the etch process so that the desired etch pattern 702 is printed on the substrate. For example, the input pattern is an after development image (ADI) pattern 712. This ADI pattern 712 is an example of the retargeted pattern.

In an embodiment, the ADI pattern is generated by biasing an edge of the etch feature 702. Then, a difference between the ADI pattern 712 and the etch feature 702 is a bias applied by the etch correction model so that an etch feature 702. In an embodiment, the bias applied by the etch correction model is based on a performance metric of the patterning process. For example, the bias determined by the etch correction model minimizes an edge placement error between the etch feature 702 and a design feature. In an embodiment, an edge of the etch feature 702 is biased by an amount B1. In embodiment, the bias B1 can be determined as a difference between the ADI pattern 712 and the etch feature 702. Thus, bias data related to target pattern (e.g., etch feature 702) is generated.

Furthermore, property (e.g., density) data is determined at one or more locations at the etch feature 702, as discussed herein. In an embodiment, property data refers to one or more property determined at the etch feature 702 of an etch pattern. Thus, the bias data and the property data can be used to establish a relationship between the property and the bias is established. Furthermore, the etch feature 702 is characterized by width and space. Thus, a relationship between the width, space, density and bias can be established. Similar data including a plurality of biases and a plurality of densities may be determined at a plurality of locations on each of a plurality of etch features, each etch feature is associated is characterized by a space and width. Thereby, the data can be used to establish a correlation between the space and width, the plurality of densities and the plurality of biases. Example biasing tables are discussed throughout the present disclosure, e.g., in FIGS. 4A-4C.

As mentioned earlier, the etch correction model is used as an example, but the present embodiment is not limited to etch. In an embodiment, a simulation process can employ any process correction model (e.g., resist process, etch process, OPC, etc.) related to the patterning process and determine the first dimension (e.g., width), the second dimension (e.g., space), and the property (e.g., density) information, as discussed herein. Then, the correction proposed by the model can be correlated to the first dimension, the second dimension, and one or more properties to generate biasing tables. The properties provide additional descriptive power to the existing rule-based retargeting methods that determine retargeted patterns for a target pattern. For example, the biasing based on density information can indicate applying a first bias at a center of line and a second bias at the line's ends.

In an example, an application can be in mask related correction, e.g., OPC and a mass proximity correction done post-OPC. In OPC, focus exposure window is maximized via the patterning process simulation. For example, the OPC process can be modified to include computation of the first dimension of the design pattern, the second dimension of the design pattern, one or more properties of the design pattern, and biasing information of the OPC generated mask pattern.

After performing OPC, effects related to mask manufacturing may also be corrected using model related to mask manufacturing process. For example, biasing information can be generated for further biasing of the OPC generated mask pattern. The post-OPC corrections may also be computationally intensive. Hence, the biasing tables can speed up the mask manufacturing process as well.

In an embodiment, the one or more procedures of the method 300 and/or the method 500 can be implemented as instructions (e.g., program code) in a processor of a computer system (e.g., process 104 of computer system 100). In an embodiment, the procedures may be distributed across a plurality of processors (e.g., parallel computation) to improve computing efficiency. In an embodiment, the computer program product comprising a non-transitory computer readable medium has instructions recorded thereon, the instructions when executed by a computer implementing the method 300 or 500.

According to present disclosure, the combination and sub-combinations of disclosed elements constitute separate embodiments. For example, a first combination includes determining a retargeted pattern using density as property. The sub-combination may include determining a retargeted pattern using a first density and a second density as the properties. In another example, the combination includes determining retargeting an etch pattern as a target pattern, the retargeting based the density data associated with the etch pattern. In another example, the combination includes determining a retargeted mask pattern for a target pattern based on the property (e.g., density).

In an embodiment, the corrections and post-OPC images determined according to the methods 300 or 500, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns.

Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2xnm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots , z_N) = \sum_{p=1}^{P} w_p f_p^2(z_1, z_2, \ldots , z_N) \quad \text{(Eq. 1)}$$

wherein $(z_1, z_2, \ldots , z_N)$ are N design variables or values thereof. $f_p(z_1, z_2, \ldots , z_N)$ can be a function of the design variables $(z_1, z_2, \ldots , z_N)$ such as a difference between an actual value and an intended value of a characteristic at an evaluation point for a set of values of the design variables of $(z_1, z_2, \ldots , z_N)$ $w_p$ is a weight constant associated with $f_p(z_1, z_2, \ldots , z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots , z_N)$ can also be a function of one or more stochastic effects such as the LWR, which are functions of the design variables $(z_1, z_2, \ldots , z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots , z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots , z_N)$ of such an evaluation point can be simply a distance between a point in the resist image to an intended position of that point (i.e., edge placement error $EPE_p(z_1, z_2, \ldots , z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots , z_N)$ is not limited the form in Eq. 1. $CF(z_1, z_2, \ldots , z_N)$ can be in any other suitable form.

It should be noted that the normal weighted root mean square (RMS) of $f_p(z_1, z_2, \ldots , z_N)$ is defined as $$\sqrt{\frac{1}{P}\sum_{p=1}^{P} w_p f_p^2(z_1, z_2, \ldots , z_N)},$$

therefore, minimizing the weighted RMS of $f_p(z_1, z_2, \ldots , z_N)$ is equivalent to minimizing the cost function $$CF(z_1, z_2, \ldots , z_N) = \sum_{p=1}^{P} w_p f_p^2(z_1, z_2, \ldots , z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z) \quad \text{(Eq. 1')}$$

Where $f_p(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \operatorname*{argmin}_{(z_1, z_2, \ldots, z_N) \in Z} CF(z_1, z_2, \ldots, z_N) = \operatorname*{argmin}_{(z_1, z_2, \ldots, z_N) \in Z} \sum_{p=1}^{P} w_p f_p^2(z_1, z_2, \ldots, z_N) \quad \text{(Eq. 2)}$$

Figure 14:
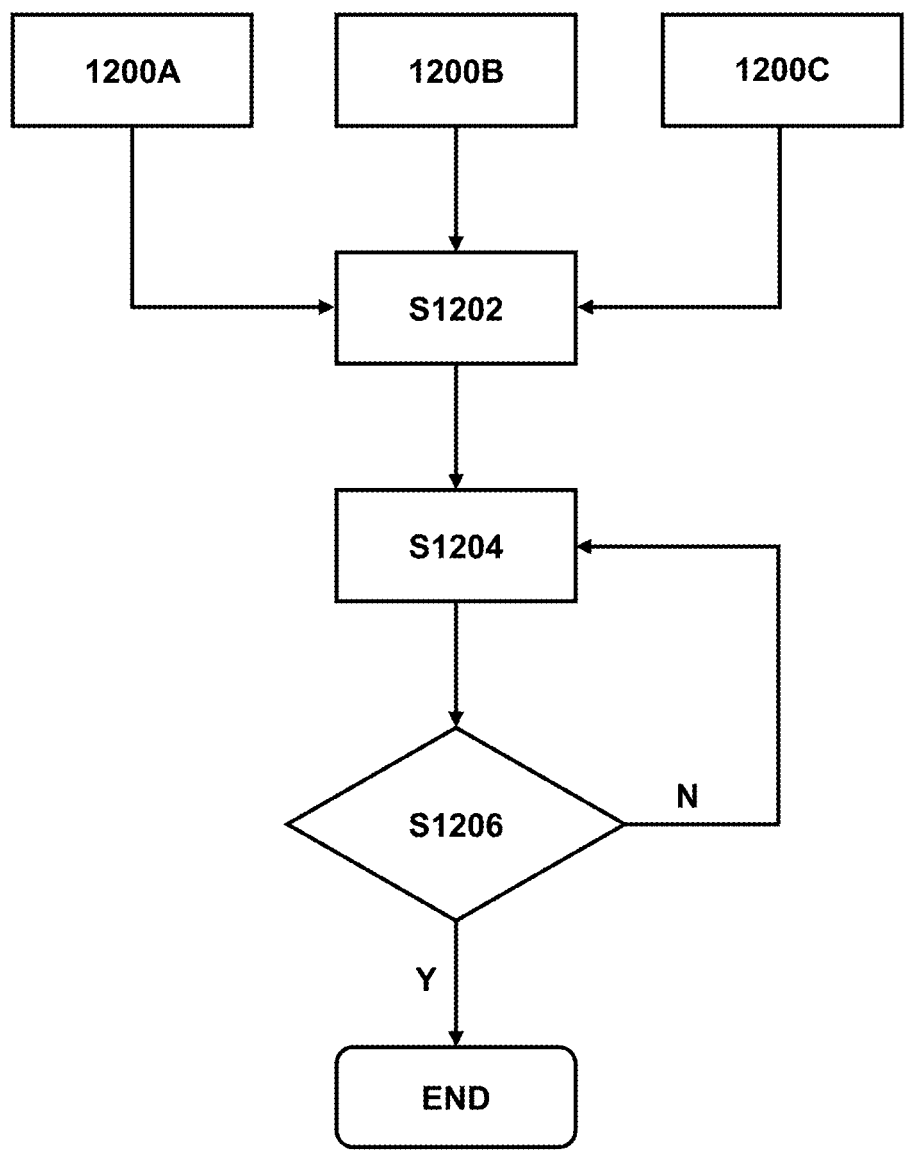
FIG. 14 is a flow diagram illustrating aspects of an example methodology of joint optimization, according to an embodiment.

A general method of optimizing the lithography projection apparatus, according to an embodiment, is illustrated in FIG. 14. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time.

The term "alternative" and "alternatively" as used herein mean that not all of the design variables are allowed to change at the same time.

Figure 15:
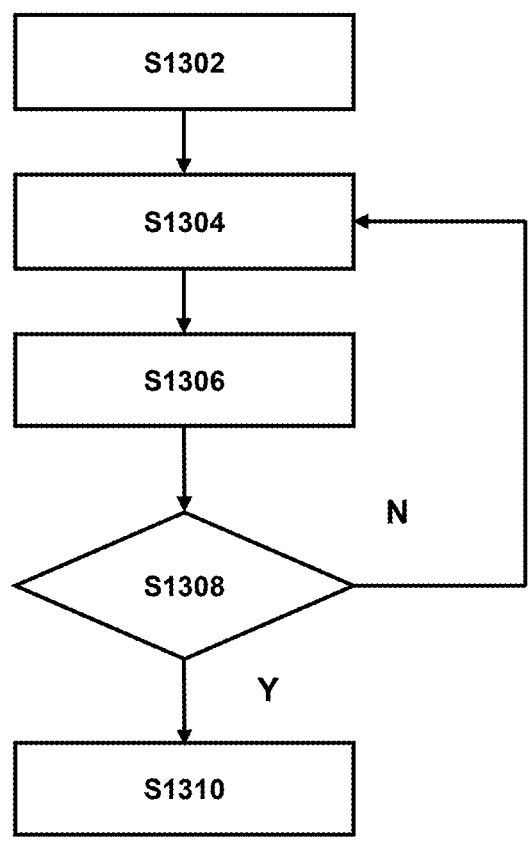
FIG. 15 shows an embodiment of another optimization method, according to an embodiment.

In FIG. 15, the optimization of all the design variables is executed simultaneously. Such flow may be called the simultaneous flow or co-optimization flow. Alternatively, the optimization of all the design variables is executed alternatively, as illustrated in FIG. 15. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 15, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 16A:
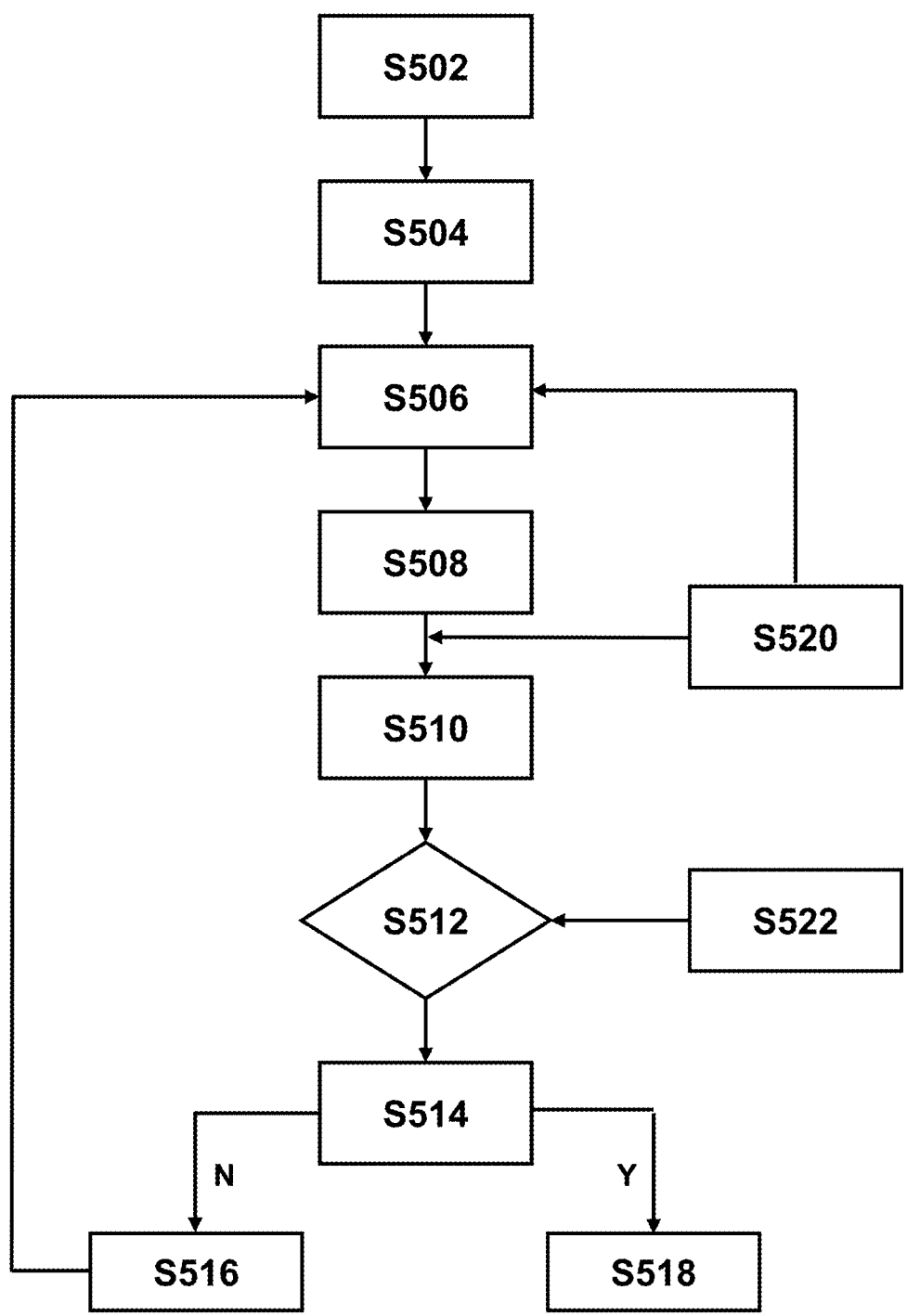
FIGS. 16A, 16B and 17 show example flowcharts of various optimization processes, according to an embodiment.

FIG. 16A shows one exemplary method of optimization, where a cost function is minimized In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 16A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1,2, ... N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find ($\tilde{z}_1, \tilde{z}_2, \tilde{z}_N$).

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_1, z_2, \ldots, z_N)$, the Gauss-Newton algorithm linearizes $f_p(z_1, z_2, \ldots, z_N)$ in the vicinity of $(z_1, z_2, \ldots, z_N)$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of CF $(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. CF $(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) = f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0,$$

wherein n=1, 2, . . . N.

If the design variables ($z_1$, $z_2$,. . . , $z_N$) are under the constraints in the form of J inequalities (e.g. tuning ranges of $$(z_1, z_2, \ldots, z_N)) \sum_{n=1}^{N} A_{nj} z_n \leq B_j,$$

for j=1, 2, . . . J; and K equalities (e.g. interdependence between the design variables)

$$\sum_{n=1}^{N} C_{nk} z_n = D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between ($z_{1(i+1)}$, $z_{2(i+1)}$, . . . , $z_{N(i+1)}$) and ($z_{1i}$, $z_{2i}$, . . . , $z_{Ni}$), so that the approximation of Eq. 3 holds. Such constraints can be expressed as $z_{ni} - \Delta_D \leq z_n \leq z_{ni} + \Delta_D$. ($z_{1(i+1)}$, $z_{2(i+1)}$, . . . , $z_{N(i+1)}$) can be derived using, for example, methods described in Numerical Optimization (2$^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for p=1, . . . P, $$\sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}} z_n \leq \quad \text{(Eq. 6')}$$

$$E_{up} + \sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}} z_{ni} -$$

$$f_p(z_{1i}, z_{2i}, \ldots, z_{Ni})$$

$$\text{and } -\sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}} z_n \leq \quad \text{(Eq. 6'')}$$

$$-E_{up} - \sum_{n=1}^{N} \frac{\partial f_p(z_1, z_2, \ldots, z_N)}{\partial z_n} \bigg|_{z_1=z_{1i}, z_2=z_{2i}, \ldots, z_N=z_{Ni}} z_{ni} +$$

$$f_p(z_{1i}, z_{2i}, \ldots, z_{Ni})$$

Since Eq. 3 is generally valid only in the vicinity of ($z_{1i}$, $z_{2i}$, . . . , $z_{Ni}$), in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_{1i}$, $z_{2i}$, . . . , $z_{Ni}$). Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \quad \text{(Eq. 6''')}$$

$$(1-\lambda) \sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity $$(f_0 \pm \Delta f, \varepsilon_0 \pm \Delta\varepsilon): CF(z_1, z_2, \ldots, z_N, f_0, \varepsilon_0) = \quad \text{(Eq. 7)}$$
$$\max_{(f,\varepsilon)=(f_0 \pm \Delta f, \varepsilon_0 \pm \Delta\varepsilon)} \max_p |f_p(z_1, z_2, \ldots, z_N, f, \varepsilon)|.$$

or $CF(z_1, z_2, \ldots, z_N, f_0, \varepsilon_0) = \quad \text{(Eq. 7')}$
$$\sum_{(f,\varepsilon)=(f_0 \pm \Delta f, \varepsilon_0 \pm \Delta\varepsilon)} \sum_p w_p f_p^2(z_1, z_2, \ldots, z_N, f, \varepsilon)$$

$CF(z_1, z_2, \ldots, z_N, f_0, \varepsilon_0) = \quad \text{(Eq. 7'')}$
$$(1-\lambda)_{(f} \sum_{(f,\varepsilon)=(f_0 \pm \Delta f, \varepsilon_0 \pm \Delta\varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \Delta\varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables ($z_1, z_2, \ldots, z_N$). In the next step, ($f_0 \pm \Delta f$, $\varepsilon_0 \pm \Delta\varepsilon$) is accepted as part of the process window, if a set of values of ($z_1, z_2, \ldots, z_N$, f, $\varepsilon$) can be found such that the cost function is within a preset limit Alternatively, if the focus and dose are not allowed to shift, the design variables ($z_1, z_2, \ldots, z_N$) are optimized with the focus and dose fixed at the nominal focus $f_0$ and nominal dose $\varepsilon_0$. In an alternative embodiment, ($f_0 \pm \Delta f$, $\varepsilon_0 \pm \Delta\varepsilon$) is accepted as part of the process window, if a set of values of ($z_1, z_2, \ldots, z_N$) can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 15. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 17:
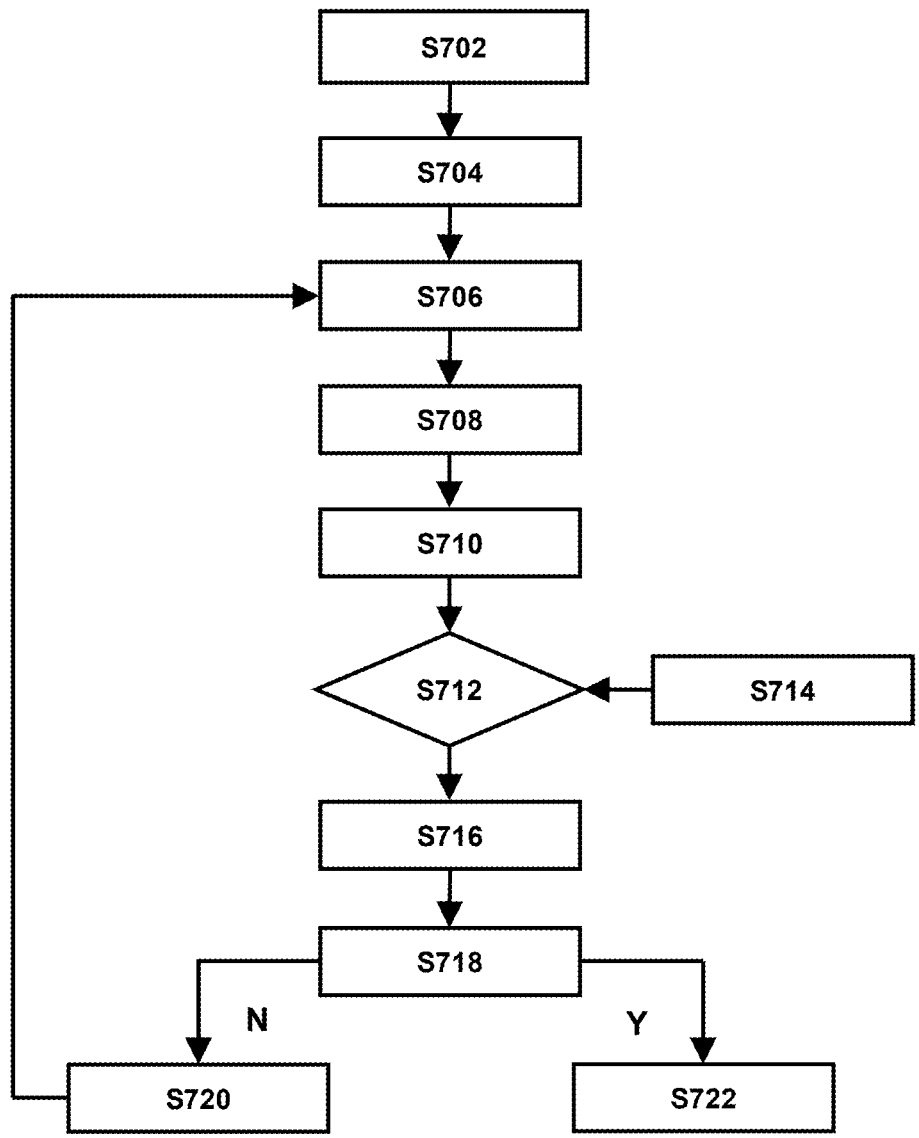

FIG. 17 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 16A. As mentioned before, the final output may be a wavefront aberration map in the pupil plane, optimized to produce the desired imaging performance. The final output may also be an optimized source map and/or an optimized design layout.

Figure 16B:
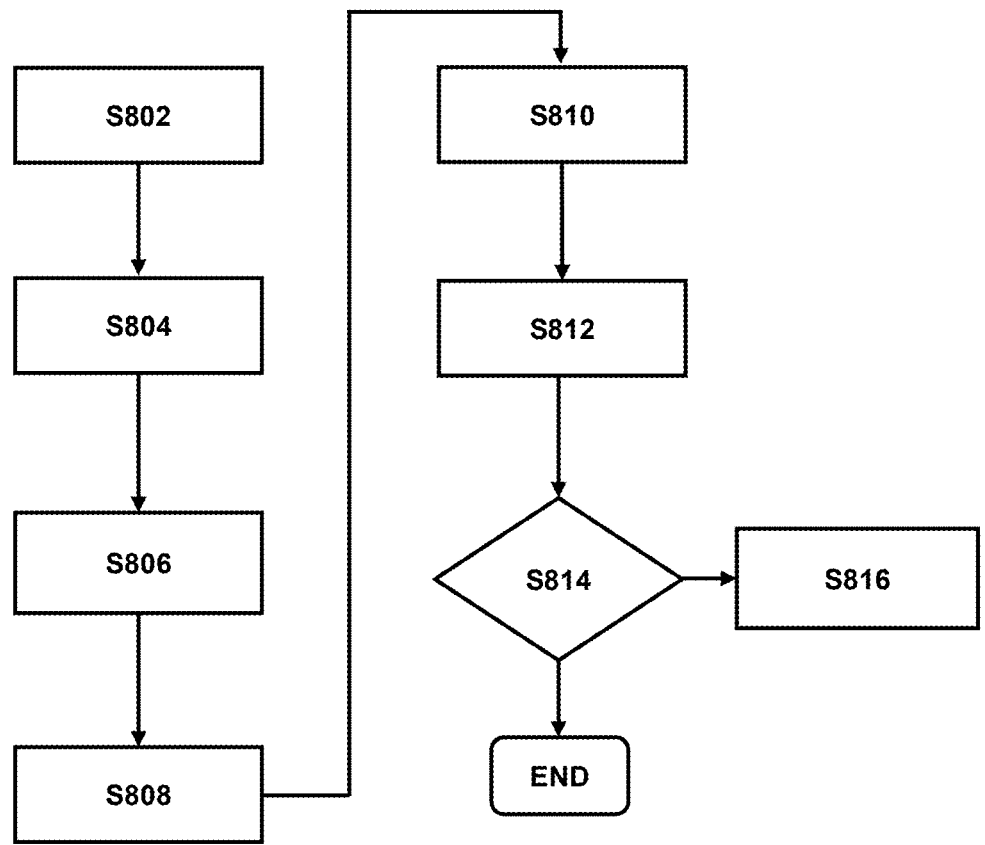

FIG. 16B shows an exemplary method to optimize the cost function where the design variables ($z_1, z_2, \ldots, z_N$) include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3A, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 18:
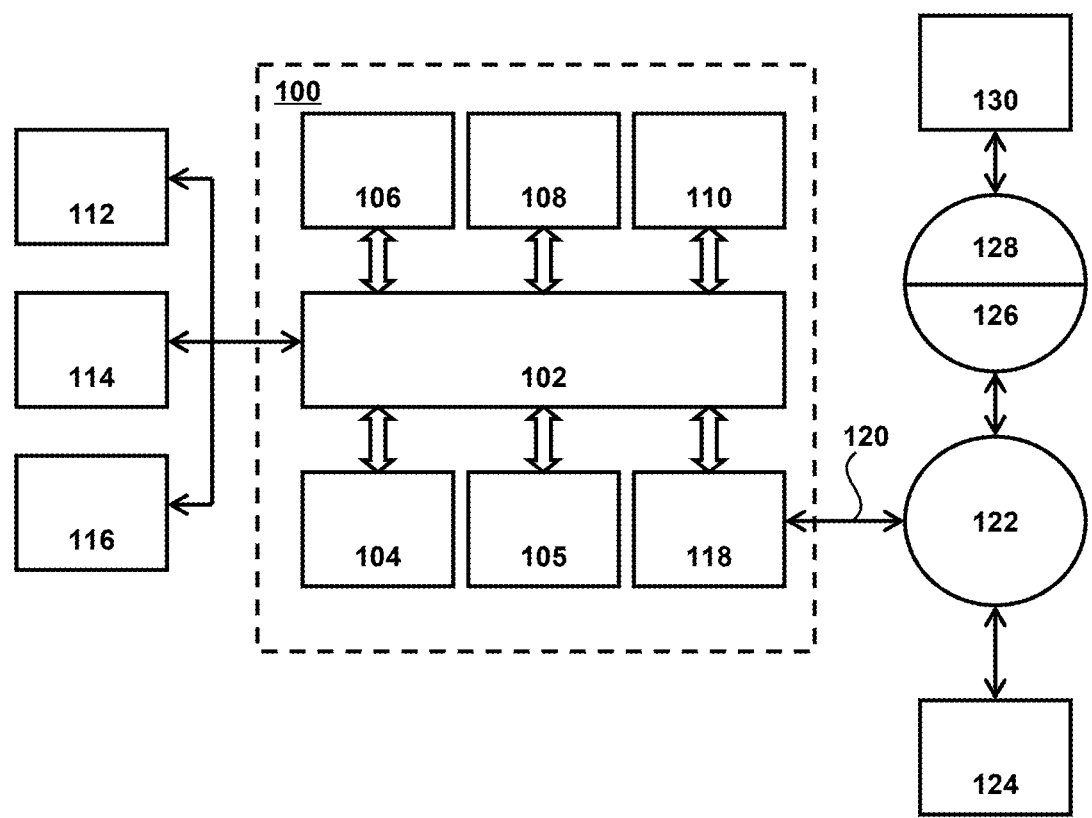
FIG. 18 is a block diagram of an example computer system, according to an embodiment.

FIG. 18 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 19:
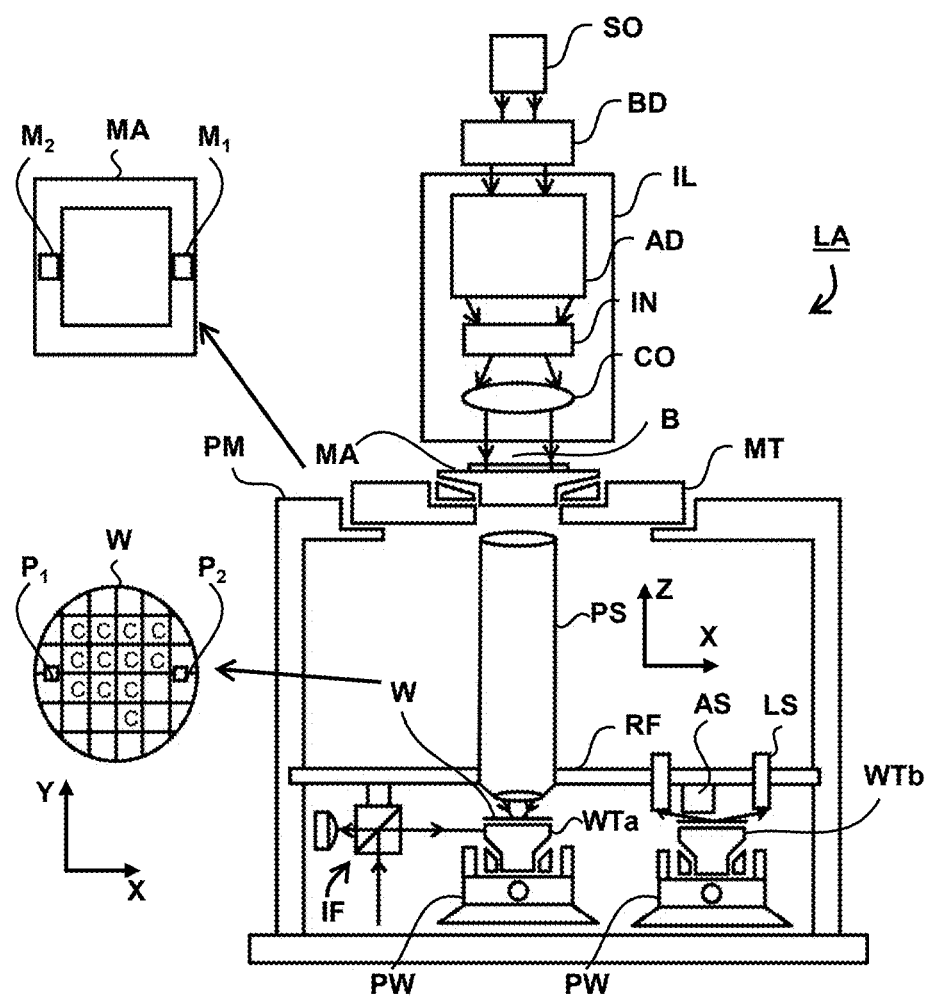
FIG. 19 is a schematic diagram of a lithographic projection apparatus, according to an embodiment.

FIG. 19 schematically depicts an exemplary lithographic projection apparatus LA whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as a-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 19 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 19. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 20:
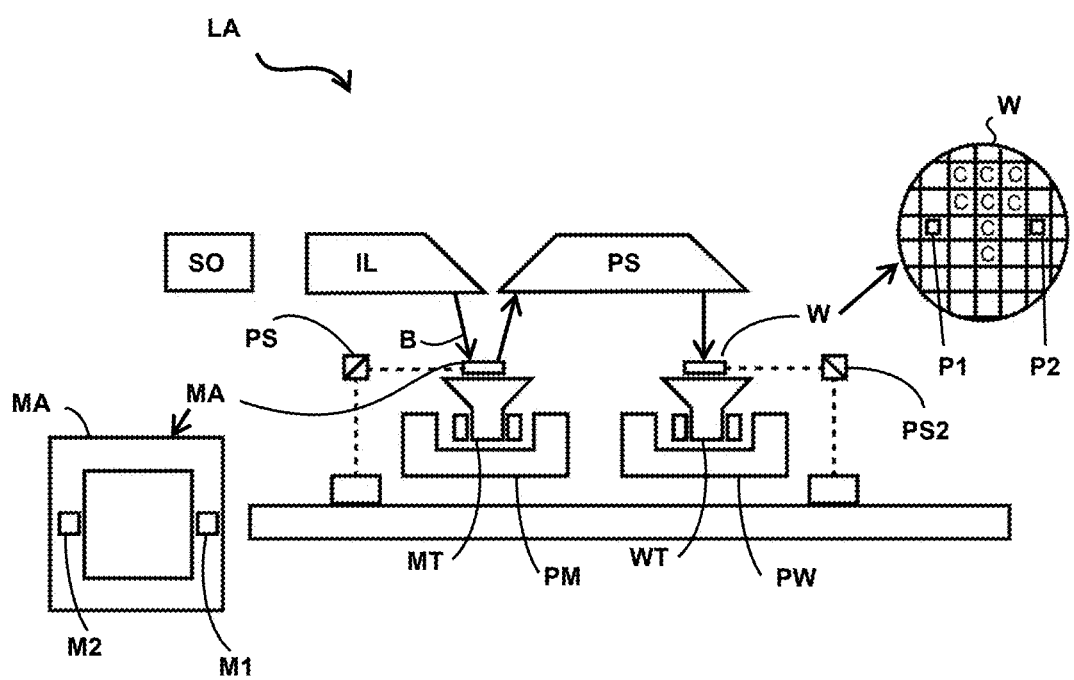
FIG. 20 is a schematic diagram of another lithographic projection apparatus, according to an embodiment.

FIG. 20 schematically depicts another exemplary lithographic projection apparatus LA whose illumination source could be optimized utilizing the methods described herein.

The lithographic projection apparatus LA includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 20, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 20, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 21:
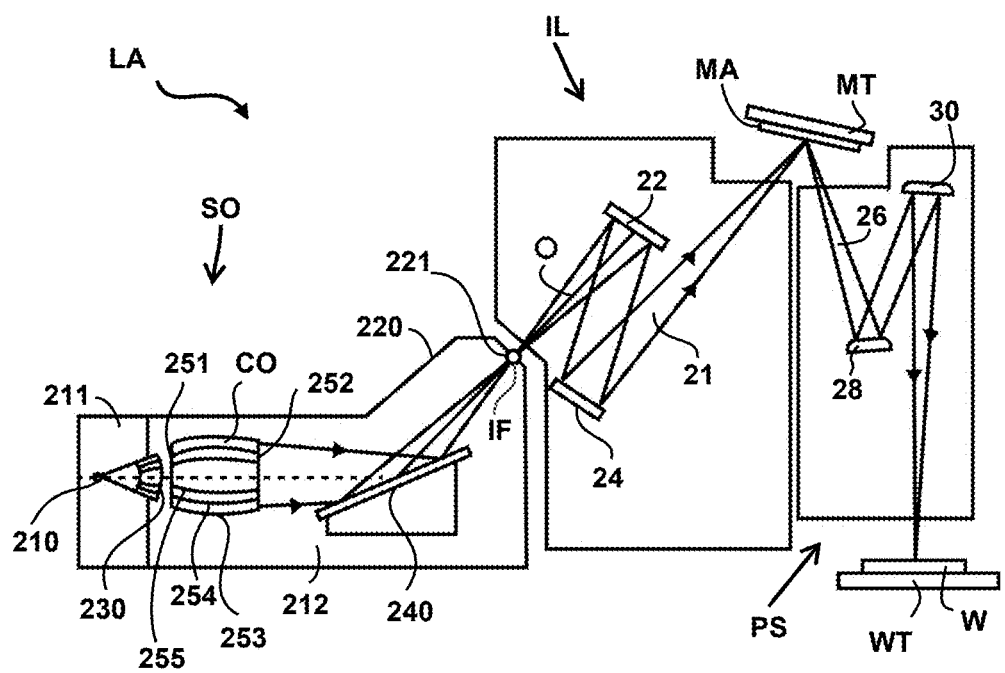
FIG. 21 is a more detailed view of the apparatus in FIG. 20, according to an embodiment.

FIG. 21 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 21.

Collector optic CO, as illustrated in FIG. 21, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 22:
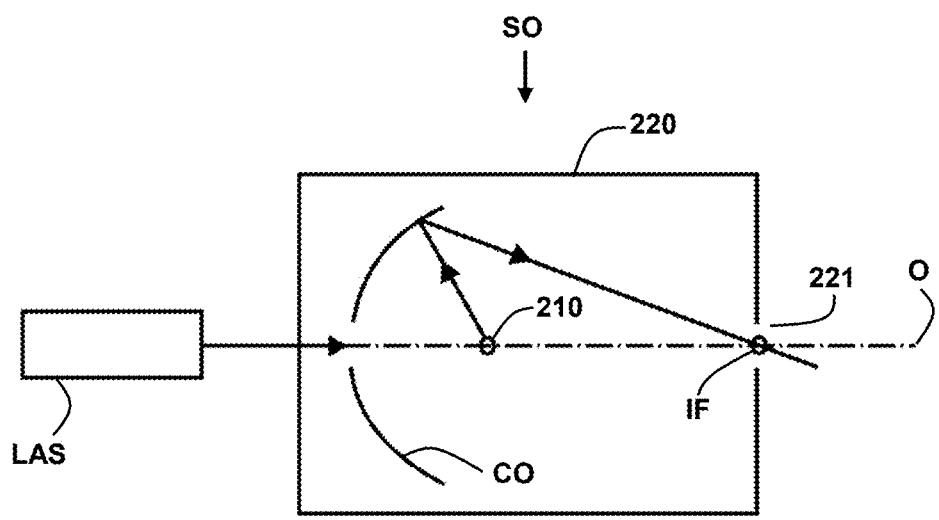
FIG. 22 is a more detailed view of the source collector module SO of the apparatus of FIGS. 20 and 21, according to an embodiment.

Alternatively, the source collector module SO may be part of an LPP radiation system as shown in FIG. 22. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Embodiments of the present disclosure can be further described by the following clauses.

1. A method for generating a retargeted pattern for a target pattern to be printed on a substrate, the method comprising:
   obtaining (i) the target pattern comprising at least one feature, the at least one feature having geometry including a first dimension and a second dimension, and (ii) a plurality of biasing rules defined as a function of the first dimension, the second dimension, and a property associated with features of the target pattern within a measurement region;
   determining values of the property at a plurality of locations on the at least one feature of the target pattern, wherein each location is surrounded by the measurement region;
   selecting, from the plurality of biasing rules based on the values of the property, a sub-set of biases for the plurality of locations on the at least one feature; and
   generating the retargeted pattern for the target pattern by applying the selected sub-set of biases to the at least one feature of the target pattern.

2. The method of clause 1, wherein the determining of the values of the property at a given location comprises:
   (a) assigning a measurement region around the given location at the at least one feature;
   (b) identifying one or more features within the measurement region;
   (c) calculating, via a user-defined function, a value of the property associated with the identified one or more features within the measurement region; and (d) selecting another location at the at least one feature, and performing steps (b), and (c) using the measurement region in (a).

3. The method of any of clauses 1-2, wherein the property is a density or a kernel.

4. The method of clause 3, wherein the calculating of the density comprises:
   determining a total area of the identified one or more features within the measurement region;
   determining a total area of the measurement region; and
   computing a density value as a ratio of the total area of features within the measurement region and the total area of the measurement region.

5. The method of any of clauses 2-4, wherein the calculating of the value of the property comprises:
   applying convolution operation between the measurement region and the user-defined function.

6. The method of clause 5, wherein the measurement region is represented as an image comprising the one or more features, and the value of the property is calculated by convoluting the image with the user-defined function.

7. The method of any of clauses 1-6, wherein the measurement region is movable across the target pattern.

8. The method of any of clauses 1-7, wherein the first dimension is a width of the at least one feature, and the second dimension is a space between the at least one feature and a neighboring feature.

9. The method of any of clauses 1-8, wherein the target pattern is a design pattern, an after development image pattern, and/or an etch pattern.

10. The method of any of clauses 1-9, wherein the selected biases for a given width and space are retarget values, each retarget value is for a portion of the at least one feature of the target pattern.

11. The method of clause 10, further comprising:
    applying each retarget value to the corresponding edge to generate the retargeted pattern; and
    applying optical proximity corrections to the retargeted pattern to produce a post-OPC pattern.

12. The method of any of clauses 1-11, wherein each bias of the plurality of biases are at least one of:
    etch compensation to be applied to an ADI pattern so that an etch pattern is within the desired specification;
    a model-error compensation associated with one or more process models used for simulating a patterning process;
    a mask proximity correction to be applied to a design layout to reduce variations in the target pattern, the variations being caused due to mask manufacturing; or
    an initial OPC biases to be applied to the design layout to generate an initial retargeted layout for optimal proximity corrections.

13. The method of any of clauses 1-12, wherein the biasing rules are represented as a table of the first dimension and the second dimension for each of the property.

14. The method of clause 13, wherein the biasing rules are represented in a plurality of tables depending on an outcome of applying the kernel used to determine the property.

15. The method of any of clauses 1-14, wherein the selecting of biases comprises:
    (a) identifying a range in which a given value of the property belongs;
    (b) selecting, for the identified range of the property, a biasing rule from the plurality of biasing rules; and
    (c) selecting, from the biasing rule, a bias value associated with the given location of the plurality of locations on the at least one feature for a given values of the first dimension and the second dimension.

16. The method of any of clauses 2-15, wherein the user-defined function is a geometric function, a signal processing function or an image processing function that transforms the one or more features within the measurement region into a characteristic value, the characteristic value being specific to the one or more features in the defined location.

17. The method of clause 16, wherein the geometric function is a function of a shape, size, relatively position of the at least one feature of the target pattern.

18. The method of clause 16, wherein the signal processing function is an image processing function, a sinusoidal function, cosine function, or a Fourier transform.

19. The method of clause 16, wherein the image processing function is a low-pass filter, and/or an edge-detection function.

20. A method for determining biasing rules for a target pattern to be printed on a substrate, the method comprising:
    obtaining the target pattern comprising at least one feature defined by a first dimension and a second dimension;
    determining, via executing the process correction model, a plurality of biases for the first dimension and the second dimension, and associating each of the plurality of biases with a value of the property, wherein the process correction model biases the first dimension and the second dimension of the at least one feature, and computes the property associated with the at least one feature; and
    defining, based on the plurality of biases, the biasing rules as a function of the first dimension, the second dimension, and the property associated with the at least one feature.

21. The method of clause 20, wherein the executing of the process correction model comprises determining a plurality of values of the property for a plurality of locations on the at least one pattern of the target pattern.

22. The method of clause 21, wherein the determining of the values of the property comprises:
    (a) assigning a measurement region around a given location on the at least feature;
    (b) identifying one or more features within the measurement region;
    (c) calculating, via a user-defined function, a value of the property associated with the identified one or more features within the measurement region; and
    (d) selecting another location on the at least one feature, and performing steps (b), and (c) using the measurement region in (a).

23. The method of any of clauses 20-22, wherein the determining of the plurality of biases comprises:
    generating, via executing the process correction model using the target pattern, a retargeted pattern comprising biases for the first dimension and the second dimension of the at least one pattern;
    determining a difference between the retargeted pattern and the target pattern; and determining, based on the difference, the plurality of biases at the plurality of locations of the target pattern.

24. The method of any of clauses 20-23, wherein the defining of the biasing rules comprises:
    defining, based on the values of the property, ranges for the property; and
    assigning, for each range of the property, a set of biases from the plurality of biases, wherein each bias of the set of bias is associated with the first dimension and the second dimension.

25. The method of any of clauses 20-24, wherein the process correction model is at least one of:
   an etch correction model that determines corrections to a etched pattern associated with the target pattern;
   an optical proximity correction model that determines modifications to the target pattern; or
   a mask proximity correction model that determines corrections associated with mask manufacturing process.
26. The method of any of clauses 20-25, wherein the plurality of biases are collected per segment of the target pattern during execution of the process correction model, a segment is a portion of the target pattern.
27. The method of any of clauses 20-26, wherein the value of the property is calculated per defined area per segment of the target pattern during execution of the process correction model, the defined area is a region around a given location of the target pattern.
28. A computer program product comprising a non-transitory computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method of generating a retargeted pattern for a target pattern to be printed on a substrate, the method comprising:
   obtaining (i) the target pattern, the target pattern comprising at least one feature having geometry including a first dimension and a second dimension, and (ii) a plurality of biasing rules defined as a function of the first dimension, the second dimension, and a property associated with a plurality of features of the target pattern;
   determining values of the property at a plurality of locations on the at least one feature of the target pattern;
   selecting, from the plurality of biasing rules based on the values of the property, a sub-set of biases for the plurality of locations on the at least one feature; and
   generating, by a hardware computer system, the retargeted pattern for the target pattern by applying the selected sub-set of biases to the at least one feature of the target pattern.

2. The method of claim 1, wherein the determining of the values of the property comprises:
   (a) assigning a measurement region around a given location at the at least one feature;
   (b) identifying one or more features within the measurement region;
   (c) calculating, via a user-defined function, a value of the property associated with the identified one or more features within the measurement region; and
   (d) selecting another location at the at least one feature, and performing steps (b) and (c) using the measurement region in (a).

3. The method of claim 2, wherein the calculating of the value of the property comprises applying a convolution operation between a measurement region and the user-defined function.

4. The method of claim 3, wherein the measurement region is represented as an image comprising the one or more features, and the value of the property is calculated by convoluting the image with the user-defined function.

5. The method of claim 2, wherein the user-defined function is a geometric function, a signal processing function or an image processing function that transforms the one or more features within the measurement region into a characteristic value, the characteristic value being specific to the one or more features in a defined location.

6. The method of claim 5, wherein the user-defined function is a geometric function and the geometric function is a function of a shape, size, or relative position of the at least one feature of the target pattern.

7. The method of claim 5, wherein the user-defined function is a signal processing function and the signal processing function is an image processing function, a sinusoidal function, cosine function, or a Fourier transform.

8. The method of claim 5, wherein the user-defined function is an image processing function and the image processing function is a low-pass filter and/or an edge-detection function.

9. The method of claim 1, wherein the property is a density of features or a kernel.

10. The method of claim 9, wherein the property is a density of features and further comprising calculating the density, the calculating the density comprising:
   determining a total area of identified one or more features within a measurement region;
   determining a total area of the measurement region; and
   computing a density value as a ratio of the total area of features within the measurement region and the total area of the measurement region.

11. The method of claim 1, wherein each location is surrounded by a measurement region and the measurement region is movable across the target pattern, and wherein the target pattern is a design pattern, an after development image pattern, and/or an etch pattern.

12. The method of claim 1, wherein the first dimension is a width of the at least one feature, and the second dimension is a space between the at least one feature and a neighboring feature, wherein the selected biases for a given width and space are retarget values, each retarget value is for a portion of the at least one feature of the target pattern, and wherein the method further comprises:
   applying each retarget value to a corresponding edge to generate the retargeted pattern; and
   applying an optical proximity correction to the retargeted pattern to produce a post-optical proximity correction pattern.

13. The method of claim 1, wherein each bias of the plurality of biases are at least one selected from:
   etch compensation to be applied to an after development inspection pattern so that an etch pattern is within the desired specification;
   a model-error compensation associated with one or more process models used for simulating a patterning process;
   a mask proximity correction to be applied to a design layout to reduce a variation in the target pattern, the variation caused due to mask manufacturing; or
   an initial OPC bias to be applied to the design layout to generate an initial retargeted layout for optimal proximity correction.

14. The method of claim 1, wherein the biasing rules are represented as a table of the first dimension and the second dimension for each of the property, or represented in a plurality of tables depending on an outcome of applying a kernel used to determine the property.

15. The method of claim 1, wherein the selecting of biases comprises:
  (a) identifying a range in which a given value of the property belongs;
  (b) selecting, for the identified range of the property, a biasing rule from the plurality of biasing rules; and
  (c) selecting, from the biasing rule, a bias value associated with a given location of the plurality of locations on the at least one feature for given values of the first dimension and the second dimension.

16. A non-transitory computer readable medium having instructions therein, the instructions, when executed by a computer system, configured to cause the computer system to at least:
  obtain (i) a target pattern to be printed on a substrate, the target pattern comprising at least one feature having geometry including a first dimension and a second dimension, and (ii) a plurality of biasing rules defined as a function of the first dimension, the second dimension, and a property associated with a plurality of features of the target pattern;
  determine values of the property at a plurality of locations on the at least one feature of the target pattern;
  select, from the plurality of biasing rules based on the values of the property, a sub-set of biases for the plurality of locations on the at least one feature; and
  generate a retargeted pattern for the target pattern by applying the selected sub-set of biases to the at least one feature of the target pattern performance of the method of claim 1.

17. The medium of claim 16, wherein the instructions configured to cause the computer system to determine the values of the property are further configured to cause the computer system to:
  (a) assign a measurement region around a given location at the at least one feature;
  (b) identify one or more features within the measurement region;
  (c) calculate, via a user-defined function, a value of the property associated with the identified one or more features within the measurement region; and
  (d) select another location at the at least one feature, and perform (b) and (c) using the measurement region in (a).

18. The medium of claim 16, wherein the property is a density of features or a kernel.

19. The medium of claim 16, wherein the first dimension is a width of the at least one feature, and the second dimension is a space between the at least one feature and a neighboring feature, wherein the selected biases for a given width and space are retarget values, each retarget value is for a portion of the at least one feature of the target pattern, and wherein the instructions are further configured to cause the computer system to:
  apply each retarget value to a corresponding edge to generate the retargeted pattern; and
  apply an optical proximity correction to the retargeted pattern to produce a post-optical proximity correction pattern.

20. The medium of claim 16, wherein each bias of the plurality of biases are at east one selected from:
  etch compensation to be applied to an after development inspection pattern so that an etch pattern is within the desired specification;
  a model-error compensation associated with one or more process models used for simulating a patterning process;
  a mask proximity correction to be applied to a design layout to reduce a variation in the target pattern, the variation caused due to mask manufacturing; or
  an initial OPC bias to be applied to the design layout to generate an initial retargeted layout for optimal proximity correction.

* * * * *

UNITED STATES PATENT AND TRADEMARK OFFICE
CERTIFICATE OF CORRECTION

| | | |
|---|---|---|
| PATENT NO. | : 12,411,422 B2 | Page 1 of 1 |
| APPLICATION NO. | : 17/769107 | |
| DATED | : September 9, 2025 | |
| INVENTOR(S) | : Ayman Hamouda | |

It is certified that error appears in the above-identified patent and that said Letters Patent is hereby corrected as shown below:

In the Specification

Column 1, Lines 7-9:
Please correct "This application is the U.S. national phase entry of PCT Patent Application No. PCT/EP2020/076639 which was filed on Sep. 24, 2022" to "This application is the U.S. national phase entry of PCT Patent Application No. PCT/EP2020/076639 which was filed on Sep. 24, 2020".

Signed and Sealed this
Twenty-first Day of October, 2025

John A. Squires
*Director of the United States Patent and Trademark Office*